(12) United States Patent
Guillaume et al.

(10) Patent No.: US 10,483,867 B2
(45) Date of Patent: Nov. 19, 2019

(54) SWITCHED MODE POWER CONVERTER CONFIGURED TO CONTROL AT LEAST ONE PHASE OF A POLYPHASE ELECTRICAL RECEIVER WITH AT LEAST THREE PHASES

(71) Applicant: THALES, Courbevoie (FR)

(72) Inventors: Michel Guillaume, Lillois-Witterzee (BE); Laurent Gleton, Courcelles (BE)

(73) Assignee: THALES, Courbevoie (FR)

( * ) Notice: Subject to any disclaimer, the term of this patent is extended or adjusted under 35 U.S.C. 154(b) by 133 days.

(21) Appl. No.: 15/933,265

(22) Filed: Mar. 22, 2018

(65) Prior Publication Data

US 2018/0278173 A1 Sep. 27, 2018

(30) Foreign Application Priority Data

Mar. 24, 2017 (EP) .................................. 17305343

(51) Int. Cl.
| | |
|---|---|
| *H02M 7/00* | (2006.01) |
| *B64G 1/00* | (2006.01) |
| *B64G 1/44* | (2006.01) |
| *B64G 1/66* | (2006.01) |
| *H01L 23/00* | (2006.01) |
| *H02J 1/00* | (2006.01) |
| *H02M 3/155* | (2006.01) |
| *H02M 7/537* | (2006.01) |

(52) U.S. Cl.
CPC ............ *H02M 7/003* (2013.01); *B64G 1/002* (2013.01); *B64G 1/443* (2013.01); *B64G 1/66* (2013.01); *H01L 24/48* (2013.01); *H02J 1/00* (2013.01); *H02M 3/155* (2013.01); *H02M 7/537* (2013.01); *H01L 2224/48091* (2013.01); *H01L 2224/48101* (2013.01); *H01L 2224/48137* (2013.01); *H01L 2924/12031* (2013.01); *H01L 2924/13055* (2013.01)

(58) Field of Classification Search
CPC ...... H02M 7/003; H02M 7/155; H02M 7/537; H02M 7/00; B64G 1/002; B64G 1/443; B64G 1/00; B64G 1/44; B64G 1/66; H01L 24/48; H01L 2224/48091; H01L 2224/48101; H01L 2224/48137; H01L 2924/12031; H01L 2924/13055; H01L 23/00; H02J 1/00
See application file for complete search history.

(56) References Cited

U.S. PATENT DOCUMENTS

| 5,731,970 A | 3/1998 | Mori et al. |
| 6,600,238 B1 | 7/2003 | Emberty et al. |

FOREIGN PATENT DOCUMENTS

| DE | 44 35 255 A1 | 4/1996 |
| DE | 10 2004 037078 A1 | 3/2006 |
| DE | 20 2013 104146 U1 | 9/2013 |
| DE | 11 2013 001234 T5 | 1/2015 |

*Primary Examiner* — Robert L Deberadinis
(74) *Attorney, Agent, or Firm* — Baker & Hostetler LLP

(57) ABSTRACT

A switched-mode power converter configured to control at least one phase of a polyphase electrical receiver with at least three phases, comprising at least one block of two converter arms, wherein a half-arm of a converter arm comprises: a first set of P≥2 switches in series; a second set of P≥2 switches in series; and a third set of diodes, arranged between the first set and the second set, comprising M≥2 subsets in series, indexed i∈[[1; M]], respectively comprising $N_i$≥2 diodes in parallel.

20 Claims, 19 Drawing Sheets

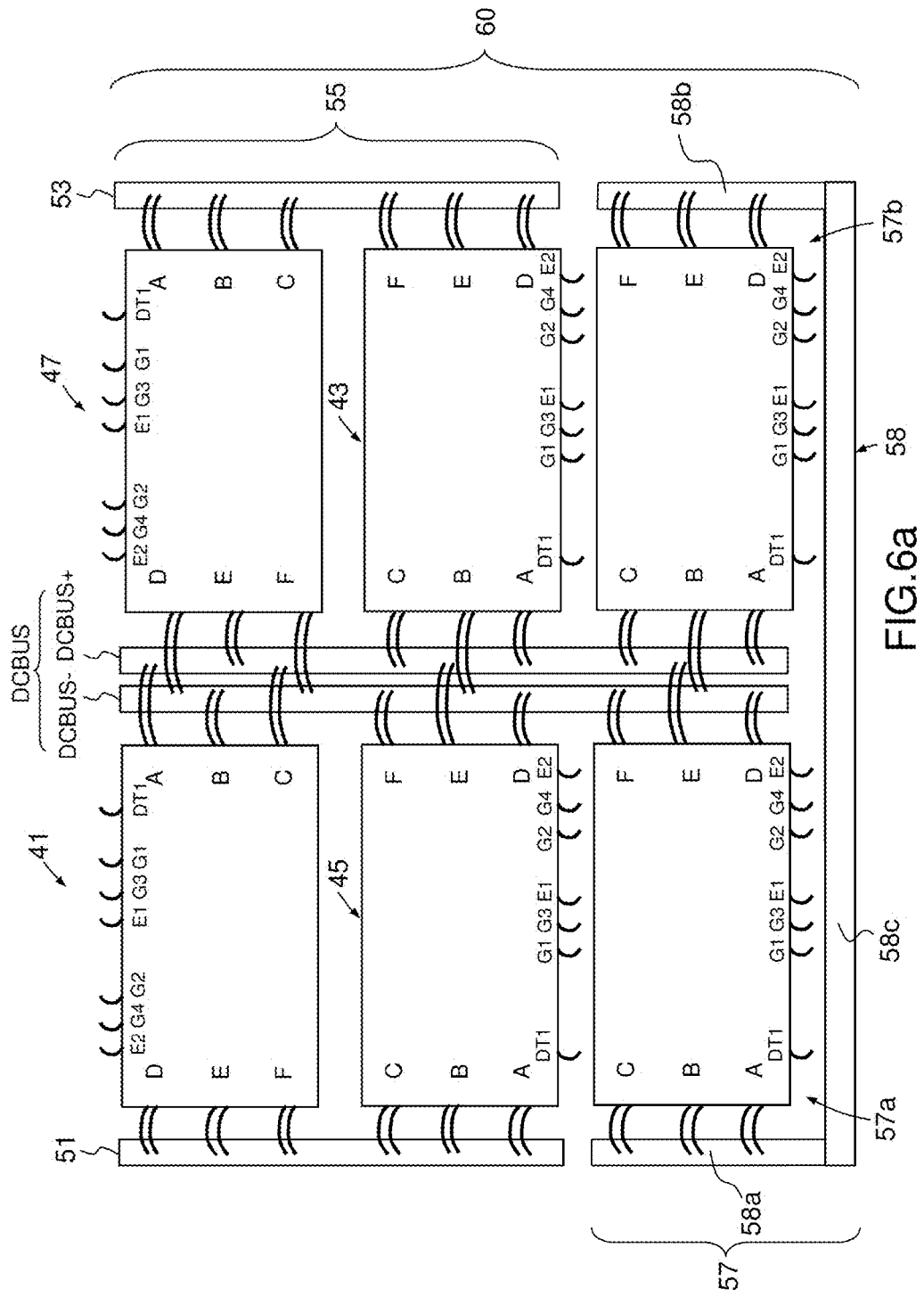

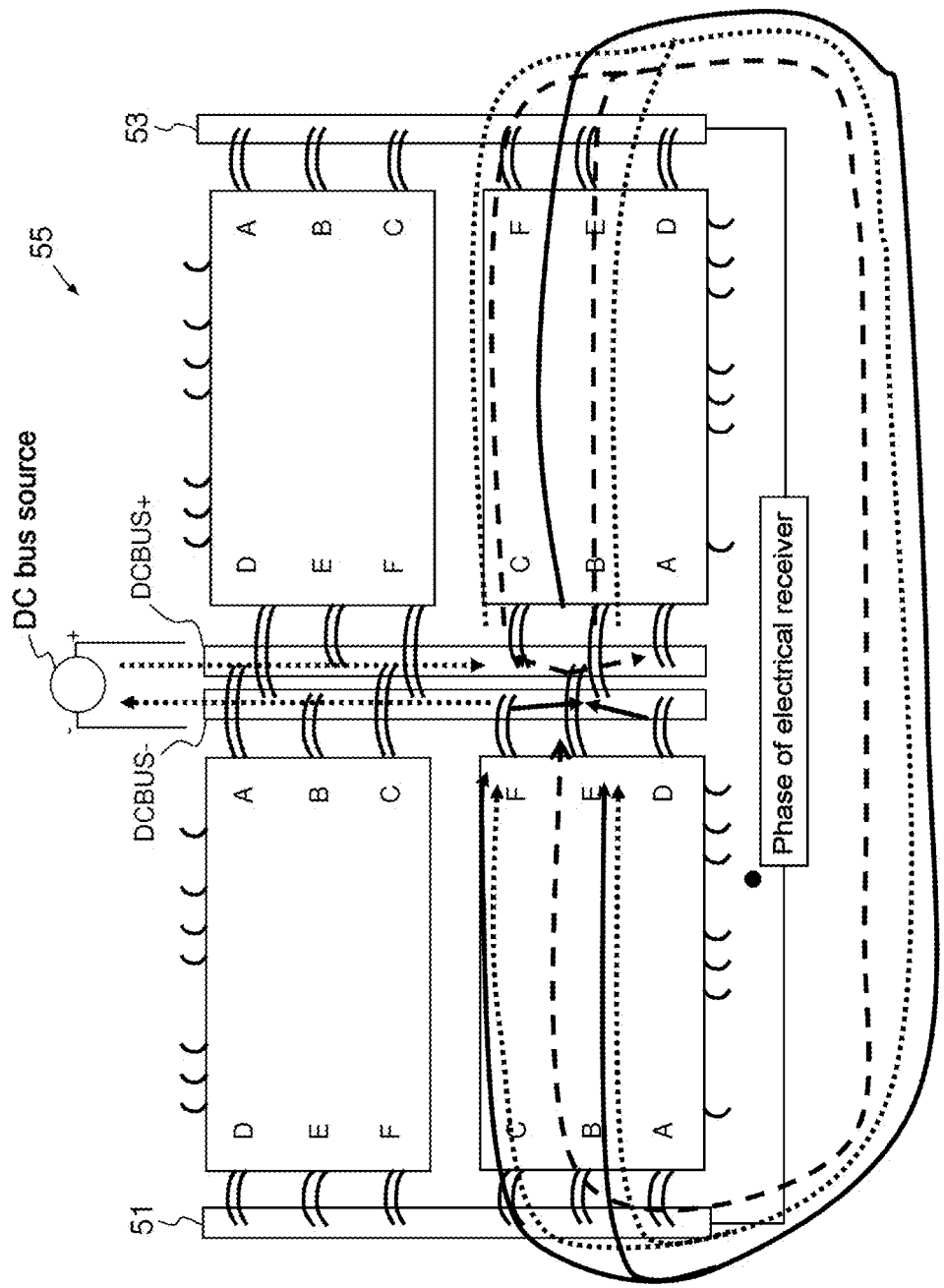

| ωt | I A | I B | I C |
|---|---|---|---|
| 0° | 1 | -0.5 | -0.5 |
| 120° | -0.5 | 1 | -0.5 |
| 240° | -0.5 | -0.5 | 1 |
| 180° | -1 | 0.5 | 0.5 |
| 300° | 0.5 | -1 | 0.5 |
| 60° | 0.5 | 0.5 | -1 |

SWITCHED MODE POWER CONVERTER CONFIGURED TO CONTROL AT LEAST ONE PHASE OF A POLYPHASE ELECTRICAL RECEIVER WITH AT LEAST THREE PHASES

CROSS-REFERENCE TO RELATED APPLICATIONS

This application claims priority to foreign European patent application No. EP 17305343.0, filed on Mar. 24, 2017, the disclosure of which is incorporated by reference in its entirety.

FIELD OF THE INVENTION

The invention relates to a power converter configured to control at least one phase of a polyphase electrical receiver with at least three phases.

In the aerospace field, the general trend is to replace the hydraulic actuators with electrical actuators in order to reduce costs, i.e. to place economically more competitive solutions on the market.

BACKGROUND

In effect, the design of electrical aeroplanes is becoming a reality with control surfaces which are actuated by electrical cylinder actuators, and likewise, for Ariane 6, the hydraulic actuators which, on Ariane 5, control the trajectory of the launch vehicle by steering the divergent nozzles of the solid boosters and of the motor of the cryogenic main stage will be replaced by electrical actuators of very high power.

Access to such power levels can be obtained only by stepping up the power supply voltage. For example, for the top stage of Ariane 5, the electrical power necessary for each of the two axes is of the order of 5 kW (at 150 V) whereas, for the solid stages of Ariane 6, the electrical power necessary for each axis will be of the order of 70 kW (at 350V).

Elsewhere, new aerospace applications, such as the Stratobus, project, an autonomous dirigible flying just above air traffic, at 20 kilometres of altitude, can culminate only in an "all-electrical" context.

The criticality of the missions that are now devolved to the electrical actuators demands the development of solutions which, while being failure-tolerant, do not disturb the mission upon the occurrence of a failure.

Also, the competition exerted in the aerospace markets demands the implementation of ever-more economically competitive solutions.

At the core of an electrical actuator there is an electronic control unit (ECPU: Electronic Control and Power Unit); the part which drives the electric motor is composed of a power inverter whose various failure modes are not allowed to affect the mission.

The power electronics in the high-reliability applications like aerospace need architectures capable of fulfilling the mission in the event of a simple failure.

In other words, it is necessary to provide a competitive solution which guarantees a continuity of service in the event of failure of an electronic component, without reconfiguring and without degrading the performance levels of the inverter.

Two families of inverters are in particular known for producing a failure-tolerant inverter.

Reconfigurable inverters are known, in which fuses are added in series with the power switches, even power switches in the phase lines to force the blowing of the fuses in certain failure cases, even power switches for isolating the failing phase and switch it to a standby inverter arm.

This type of architecture presupposes that a simple failure has not caused failure propagation to the other components of the inverter, even short-circuiting of the battery, that all the potential failures can be identified unambiguously, that the fuses blow in all the cases and that the reconfiguration switches do not require a more complex implementation than the redundancy of the inverter arms.

Furthermore, the operation of these inverters assumes the availability of failure detection means and of conducting the appropriate action of reconfiguration of the inverter which temporarily inhibits the operation thereof.

Thus, the applications which demand total availability of the inverter will not be able to use this type of architecture because, upon the occurrence of a simple failure, the operation of the inverter is degraded, even stopped, and this lack of availability lasts for the time required to detect the failure, to identify the corrective action to be carried out and to conduct the corrective action. In the case of Ariane 6, the mission of a solid stage lasts approximately 2 minutes and 20 seconds during which the launch vehicle leaves the launch pad to reach an altitude of 70 kilometres. Such a mission demands permanent availability of the equipment.

One known means for managing the risks of failure consists in designing inverters with redundancy based on the multiplication of the active components for the failure of one component to be compensated, naturally, by a redundant component. To safeguard against the various failure cases, this type of architecture leads to quadrupling the components:

to avoid the effect of the short-circuit failure of a component, a second component is added in series; if it is a controlled component, the control is also duplicated.

To avoid the effect of an open circuit failure of a component, a second component is added in parallel; if it is a controlled component, the control is also duplicated.

Similarly, in the switched-mode power converters embedded in the satellites, the architectures of the switching cells have to be able to naturally compensate the failure of a component.

The major defect with these solutions is the multiplication of the components which increases the costs and, by increasing the size of the implementation, by also increasing the stray inductances which generate switching overvoltages.

One known means for increasing the current-carrying capacity of a power device is to use the parallel-connection of subsets of lesser capacity, such that their sum capacity equals the required capacity; this condition is valid only if the distribution of the current between the difference subsets is equal.

SUMMARY OF THE INVENTION

The present invention aims to mitigate the abovementioned drawbacks and, in particular the problem of failure tolerance without reconfiguration or degradation of the performance levels of the inverter.

According to one aspect of the invention, a switched-mode power converter is proposed that is configured to control at least one phase of a polyphase electrical receiver with at least three phases, comprising at least one block of two converter arms, in which a half-arm of a converter arm comprises:

a first set of P≥2 switches in series;
a second set of P≥2 switches in series; and a third set of diodes, arranged between the first set and the second set, comprising M≥2 subsets in series, indexed i∈[[1; M]], respectively comprising $N_i \geq 2$ diodes in parallel.

Thus, the series-connection of the switches, on the one hand, and the series-connection of the diodes, on the other hand, allows for a tolerance to the simple short-circuit failure of the elements. The parallel-connection of the $N_i \geq 2$ diodes allows the tolerance to simple open-circuit failure of a diode whereas the parallel-connection of two sets of switches in parallel allows the tolerance to simple open-circuit failure of a switch.

Furthermore since the diodes of a subset are in parallel, with an excellent thermal coupling between them, if one diode heats up, it also heats up the other diodes, thus tending to maintain a good distribution of the current between them.

Furthermore, since the sets of switches are in parallel with a minimised thermal coupling (two different sets ENS1 and ENS2), if one switch heats up, the thermal segregation with the other switches of the other set allows it to heat up freely, without interfering with the other switches of the other set, thus tending to maintain the good distribution of the current.

Furthermore, in its operation, the inverter half-arm is passed through by the phase current, alternating, in the set of diodes in series then, divided into two, in the two series of switches. The arrangement of the diodes between the switches makes it possible to create a same mean path of the current, whether the current circulates in the series of diodes or, divided into two, in the two series of switches. Because of this, the magnetic field developed around the inverter half-arm by the circulation of the current varies little and, the stray switching inductances thus reduced to the minimum. The overvoltages at the diodes and the switches are thus reduced to the minimum.

Also, a polyphase electrical receiver having at least three independent phases has, intrinsically, a phase redundancy.

It is thus possible to design a power converter which exploits this property of the electrical receiver in such a way that an open-circuit failure of the converter or of the receiver is compensated by the redundant nature of the receiver; this approach makes it possible to limit the redundancy, for the converter, to a series redundancy which therefore requires half as many components as a conventional series-parallel redundancy.

According to one embodiment, the M subsets comprise a same number of $N_i$ diodes in parallel.

Thus, the behaviour of an inverter half-arm, in case of short-circuit failure of a diode, is identical regardless of the subset of diodes affected.

In one embodiment, the switched-mode power converter comprises at least one temperature sensor.

The presence of at least one temperature sensor makes it possible to control the operating temperature of the inverter. Based on this control, an inhibition of the inverter in case of high temperature makes it possible to avoid failures caused by junction temperatures of the semiconductors of the switches and of the diodes being exceeded.

According to one embodiment, the switches of the first set are aligned and/or the switches of the second set are aligned and/or the subsets of diodes of the third set are aligned.

Thus, the difference of mean path of the current between the diodes and the two series of switches is minimised, reducing the stray switching inductance and therefore the overvoltages at the diodes and the switches, to the minimum.

In one embodiment, a block of two arms comprises a coplanar electrical power supply, provided with a positive line and a negative line, arranged so as to separate two arms of the converter, and comprising a power interface for each arm, each power interface being arranged such that the two half-arms of the corresponding arm, i.e. the positive half-arm and the negative half-arm, are situated between the coplanar electrical power supply and the corresponding power interface.

Thus, the connections of the inverter half-arms are made with a minimum of stray inductance so as to reduce the overvoltages generated upon the switching on the switches and the diodes. In effect, the point of summation of the currents switched in the power interface is centred relative to the connection of the switches and the diodes, the rest of the power interface being passed through by the phase current. Since the coplanar power supply lines have a very low stray inductance, the power supply of the inverter half-arms is assured with a minimum of overvoltage upon the switching.

According to one embodiment, two half-arms forming an arm of a block of two arms of the converter comprise:

a positive half-arm comprising a third set connected between the negative line of the coplanar electrical power supply and the corresponding power interface, and a first set and a second set connected between the positive line of the coplanar electrical power supply and the corresponding power interface, and a negative half-arm comprising a third set connected between the positive line of the coplanar electrical power supply and the corresponding power interface, and a first set and a second set connected between the negative line of the coplanar electrical power supply and the corresponding power interface.

Thus, upon the switching, these two half-arms exchange electrical current, on the one hand, the phase current through their power interfaces and the phase of the receiver and, on the other hand, switched currents through the coplanar power supply lines. Since the coplanar power supply lines have a very low stray inductance, the power supply of the inverter half-arms is assured with a minimum of overvoltage upon the switching.

For example, a negative half-arm of an arm of a block of two arms of the converter is arranged facing a positive half-arm of the other arm of the block of two arms of the converter, relative to the coplanar electrical power supply.

The facing arrangement of the two inverter half-arms makes it possible to optimise and reduce the length of the circulation of the switched currents in the coplanar lines so as to reduce to the absolute minimum the stray inductances and the switching overvoltages which are associated with them.

In one embodiment, when the number of arms is odd, the converter comprises said blocks of two arms, and a block of two arms provided with an additional arm.

Thus, the production of the inverter with odd number of arms is carried out in such a way as to reduce the stray inductances and the associated switching overvoltages.

For example, said block of two arms is provided with an additional arm comprising two half-arms arranged on either side of the extended coplanar electrical power supply, and a power interface of said additional arm comprising respectively, for each of the two half-arms, a part arranged such that the corresponding half-arm is situated between the coplanar electrical power supply and said part of the corresponding power interface.

Thus, the production of the inverter with odd number of arms can be derived from a production with two inverter arms; the addition of the third arm amounts to duplicating the layout of a pair of facing half-arms, thus making it possible to exploit production tools developed for a production with two inverter arms.

For example, said block of two arms provided with an additional arm also comprises an additional portion of coplanar electrical power supply portion arranged at one end and in a different direction from the rest of the coplanar electrical power supply, and a power interface of said additional arm arranged such that said additional arm is situated between said additional portion of coplanar electrical power supply and said corresponding power interface.

Thus, this embodiment makes it possible to simplify the power interface of the additional arm.

For example, said additional portion of coplanar electrical power supply is substantially at right angles to the rest of the coplanar electrical power supply.

Thus, the circulation paths of the switching currents of the two half-arms of the additional arm in the coplanar power supply lines are symmetrical, such that the operation of the inverter arm is independent of the direction of the phase current.

According to one embodiment, the switched-mode power converter is hybrid.

Thus, the use of the hybrid technologies makes it possible to maximise the compactness of the inverter; a compact solution, through the reduction of the lengths, makes it possible to greatly reduce the stray inductances and the overvoltages which are associated with them. Also, the increased compactness of the production makes it possible to reduce the weight thereof and, by using less space in the final equipment, makes it possible to also reduce the weight thereof.

Furthermore, the use of the hybrid technologies makes it possible to optimise the thermal couplings between the components.

Thus, since the diodes of a subset are in parallel on the same copper surface guaranteeing an excellent thermal coupling between them, if one diode heats up, it also heats up the other diodes, thus tending to maintain a good distribution of the current between them.

Furthermore, since the sets of switches are in parallel on different and separate copper surfaces (two different sets), if one switch heats up, the thermal segregation with the other switches of the other set allows it to heat up freely, without interfering with the other switches of the other set, thus tending to maintain the good distribution of the current.

A hybrid converter should be understood to be a module comprising one or more insulated substrates, generally of ceramic, on which active and passive components are interconnected in order to produce an electrical function; the active components being able to be bare chips or encapsulated components, the passive components being able to be printed on the substrate or be surface-mounted components. In all cases, the components are mounted on the surface. The substrates are encapsulated in a package through which interconnections make it possible to access the internal electrical function of the module.

According to one embodiment, the switches comprise at least one insulated gate bipolar transistor and/or at least one insulated gate field effect transistor.

Thus, the control of the switch is simplified; when the gate is biased, the switch is active, when the gate is unbiased, the switch is inhibited. The control circuit is then fairly simple since it has to inject electrical charges into the gate to activate the switch and remove these charges to inhibit it. Also, since the inhibition of the switch is a function only of the control of the gate, unlike a thyristor, for example, the switch can be used equally in topologies with natural switching, that is to say those in which the switch is open when the current which passes through it is cancelled, and in topologies with forced switching, that is to say those in which the switch is open while the current passes through it.

For example, said converter is an inverter or a chopper.

According to another aspect of the invention, there is also proposed a control system of at least one electrical cylinder actuator of a space launch vehicle comprising at least one switched-mode power converter as described above, the electrical receiver being an electric motor and the power converter being an inverter.

Thus, the control system allows a fine modulation of the power applied to the cylinder actuator. Also, since the inverter is reversible, it makes it possible to return to the battery the energy which is extracted from the cylinder actuator instead of losing it, as in a lost-oil hydraulic system used currently on the lower stages of Ariane 5.

According to another aspect of the invention, a space launch vehicle is also proposed that is provided with a system as described previously.

Thus, such a system makes it possible to free the operator of the launch vehicle of the operating constraints generated by the security measures to be implemented upon the use of lost-oil hydraulic systems in which the energy source consists of large tanks of oil highly pressurised by compressed air at 200 bars. Furthermore, such a system can be powered from thermal batteries which, having the particular feature of being inert as long as they are not activated, allow the operator of the launch vehicle to also be freed of the operating constraints associated with the use of electrical storage batteries.

According to another aspect of the invention, there is also proposed a control system of at least one steering device for antennas or solar panels of a satellite comprising at least one switch-mode power converter as previously described, the electrical receiver being an electric motor and the power converter being an inverter.

Thus, the overvoltage levels at the terminals of the converter can be limited relative to those induced by the other systems, allowing a more appropriate dimensioning of the system.

According to another aspect of the invention, there is also proposed a satellite provided with a control system as previously described.

According to another aspect of the invention, there is also proposed a power supply system of a satellite comprising at least one switched-mode power converter as previously described, the electrical receiver being a polyphase transformer and the power converter being an inverter or chopper.

Thus, the overvoltage levels at the terminals of the converter can be limited relative to those induced by the other systems, allowing a more appropriate dimensioning of the system.

According to another aspect of the invention, there is also proposed a satellite provided with a power supply system as previously described.

More generally, the present invention can be applied to any application in which the control of the overvoltages is required, even an orbital station.

BRIEF DESCRIPTION OF THE DRAWINGS

The invention will be better understood on studying a few embodiments described as nonlimiting examples and illustrated by the attached drawings in which:

FIGS. 6a and 6b represent examples of production of a block of two arms provided with an additional arm for an odd total number of arms, according to various aspects of the invention;

FIGS. 7a and 7b illustrate the circulations of the electrical currents in a block of two arms used as H bridge for an electrical receiver phase respectively for a positive electrical current and a negative electrical current.

In the different figures, the elements that have identical references are identical. In the following examples, N is 2, but obviously the examples described apply, as a variant, to any value of N.

DETAILED DESCRIPTION

Figure 1A:
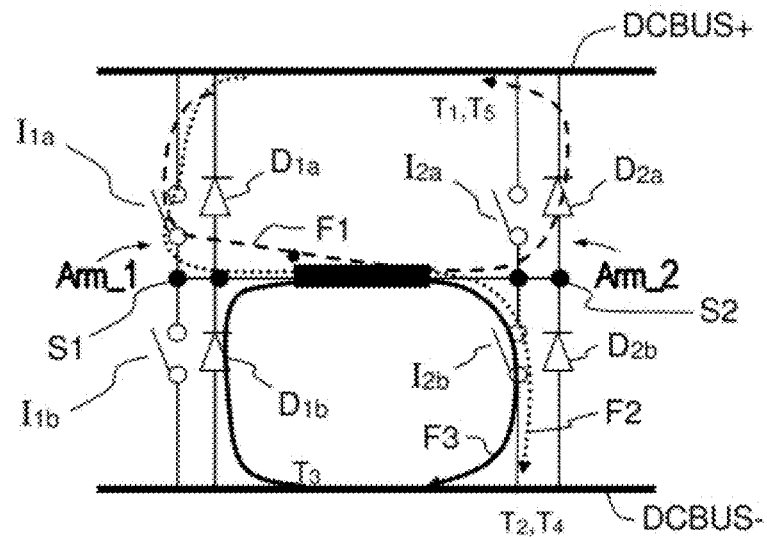
FIGS. 1a and 1b schematically illustrate the five moments of a switching period of the electrical voltage in the operation of an inverter H bridge for a positive phase electrical current of an electrical receiver.
Figure 1B:
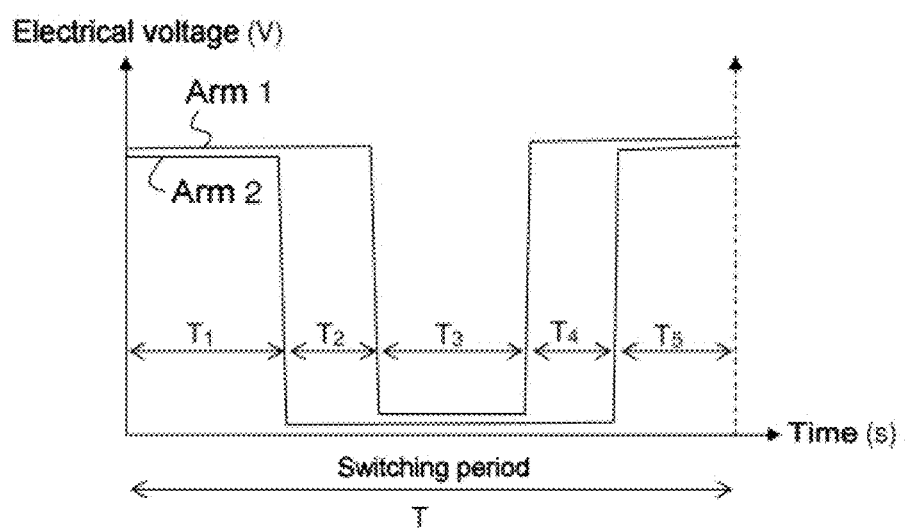

FIGS. 1a and 1b represent the five moments of a switching period of the electrical voltage in the operation of an inverter H bridge for a positive phase electrical current of an electrical receiver. A positive phase electrical current denotes a current incoming via the Active terminal of the phase, identified by a large dot in the figures, and outgoing via the Return terminal of the phase. The Active and Return designation of the terminals of the phase is determined by the manufacturer of the electrical receiver as a function of the direction of the magnetic field developed by the phase within the electrical receiver.

FIG. 1a represents an inverter H bridge controlling a phase Phase of an electrical receiver such as an electric motor comprising a positive electrical power supply DCBUS+ and a negative electrical power supply DCBUS−, and the two arms of the H bridge, Bras_1 and Bras_2.

The first arm Bras_1 of the H bridge comprises two switches $I_{1a}$, $I_{1b}$ and two diodes $D_{1a}$, $D_{1b}$, and the second arm Bras_2 of the H bridge comprises two switches $I_{2a}$, $I_{2b}$ and two diodes $D_{2a}$, $D_{2b}$.

FIG. 1b represents five successive moments $T_1$, $T_2$, $T_3$, $T_4$ and $T_5$ of a switching period of a positive phase electrical current in the H bridge, for the electrical voltages measured respectively at the points S1 and S2 relative to the DCBUS− power supply line of the two arms Arm_1, Arm_2.

The moments $T_1$ and $T_5$ correspond to the cases of the switches ha of the first arm Arm_1 and $I_{2a}$ of the second arm Arm_2 closed or active, in which the phase electrical current is looped back through the positive power supply line DCBUS+; these delays correspond to a positive "freewheel", as illustrated by the dotted line arrow F1.

"Freewheel" should be understood to mean the following. If a certain level of electrical current is required to be passed into an inductance or induction coil from an electrical voltage source, the best way is to take a switch and to deliver to the inductance regular voltage pulses whose value, in volts, and duration, in seconds, cause the electrical current in the inductance to be increased according to the law di/dt=e/L, in which i represents the intensity of the electrical current in amperes, L represents the inductance in henrys, and e represents the electromotive force, in volts. The problem, with an inductance, is that the electrical current cannot be interrupted abruptly; in fact, according to the same law, rapidly cancelling an existing electrical current requires an infinite voltage to be developed at the terminals of the inductance. Also, an inductance passed through by an electrical current i contains a stored energy W=½ $Li^2$; as long as the electrical current circulates, this energy remains stored in the inductance, including if it is short-circuited; by contrast, if an external circuit forces it to develop the electrical voltage, its energy decreases. Also, to power an inductance, it is necessary to alternate the power supply periods of the inductance with so-called "freewheel" periods, during which the electrical current which was previously circulating in the inductance is maintained by an external circuit, under the lowest possible voltage, so as to conserve the energy in the inductance.

The "freewheel", somewhat as in the case of a bicycle, is a period during which the electrical current circulates without leading to a notable increase or reduction of the energy stored in the inductance.

The moments $T_2$ and $T_4$ correspond to the cases of the switches ha of the first arm Arm_1 and $I_{2b}$ of the second arm Arm_2 closed or active, in which the phase electrical current is derived from the positive power supply line DCBUS+ to the negative power supply line DCBUS−; these delays correspond to the transfer of energy, as illustrated by the dotted line arrow F2.

The moment $T_3$ corresponds to the cases of the switches $I_{1b}$ of the first arm Arm_1 and $I_{2b}$ of the second arm Arm_2 closed or active, in which the phase current is looped back through the negative power supply line DCBUS−; this delay corresponds to a negative "freewheel", as illustrated by the solid or continuous line arrow F3.

Figure 2A:
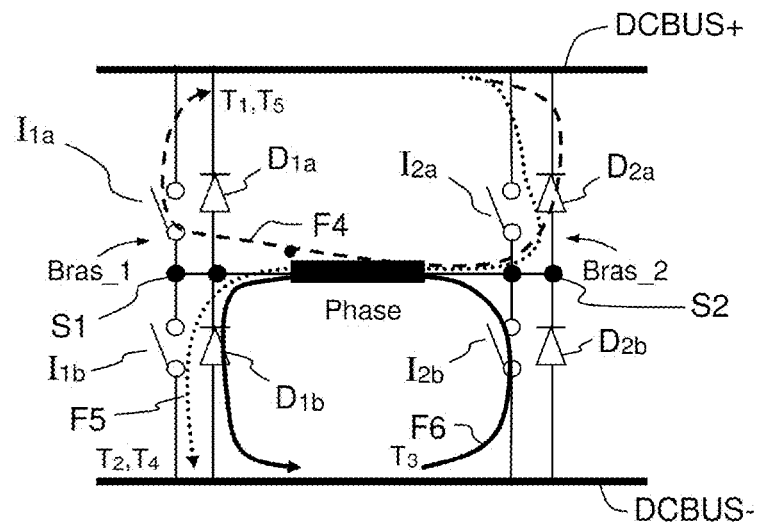
FIGS. 2a and 2b schematically illustrate the five moments of a switching period of the electrical voltage in the operation of an inverter H bridge for a negative phase electrical current of an electrical receiver.
Figure 2B:
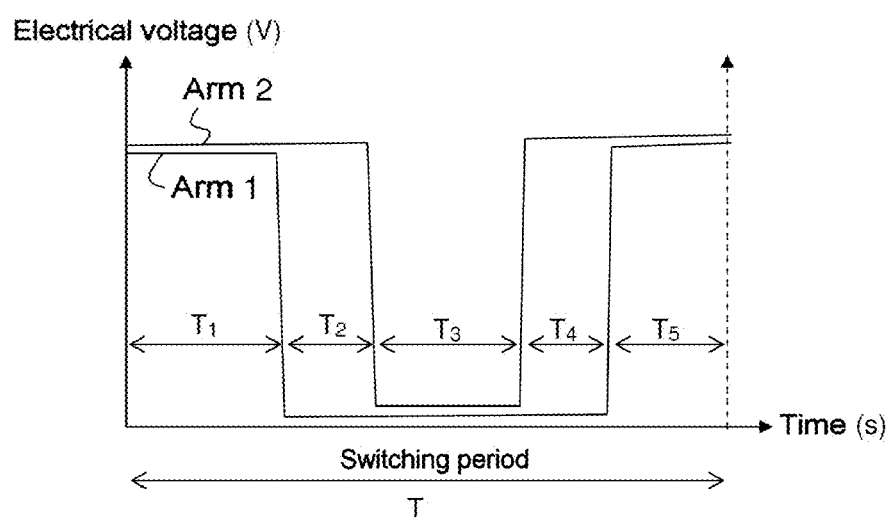

FIGS. 2a and 2b represent the five moments of a switching period of the electrical voltage in the operation of an inverter H bridge for a negative phase electrical current of an electrical receiver. A negative phase electrical current designates a current incoming through via the Return terminal of the phase and outgoing via the Active terminal of the phase, identified by a dot in the diagram. The Active and Return designation of the terminals of the phase is determined by the manufacturer of the electrical receiver as a function of the direction of the magnetic field developed by the phase within the electrical receiver.

FIG. 2a represents an inverter H bridge controlling a phase Phase of an electrical receiver such as an electric motor comprising a positive electrical power supply DCBUS+ and a negative electrical power supply DCBUS−, and the two arms of the H bridge, Bras1 and Bras2.

The first arm Arm_1 of the H bridge comprises two switches $I_{1a}$, $I_{1b}$ and two diodes $D_{1a}$, $D_{1b}$, and the second arm Arm_2 of the H bridge comprises two switches $I_{2a}$, $I_{2b}$ and two diodes $D_{2a}$, $D_{2b}$.

FIG. 2b represents five successive moments $T_1$, $T_2$, $T_3$, $T_4$ and $T_5$ of a switching period of a negative phase electric current in the H bridge, for the electrical voltages measured respectively at the points S1 and S2 relative to the DCBUS− power supply line of the two arms Arm_1, Arm_2.

The moments $T_1$ and $T_5$ correspond to the cases of the switches ha of the first arm Arm_1 and $I_{2a}$ of the second arm Arm_2 closed or active, in which the phase electrical current is looped back through the positive power supply line DCBUS+; these delays correspond to a positive "freewheel", as illustrated by the broken line arrow F4.

The moments $T_2$ and $T_4$ correspond to the cases of the switches $I_{1b}$ of the first arm Arm_1 and $I_{2a}$ of the second arm Arm_2 closed or active, in which the phase electrical current is derived from the positive power supply line DCBUS+ to the negative power supply line DCBUS−; these delays correspond to the transfer of energy, as illustrated by the dotted line arrow F5.

The moment $T_3$ corresponds to the cases of the switches $I_{1b}$ of the first arm Arm_1 and $I_{2b}$ of the second arm Arm_2 closed or active, in which the phase electrical current is looped back through the negative power supply line DCBUS−; this delay corresponds to a negative "freewheel", as illustrated by the solid or continuous line arrow F6.

Figure 3A:
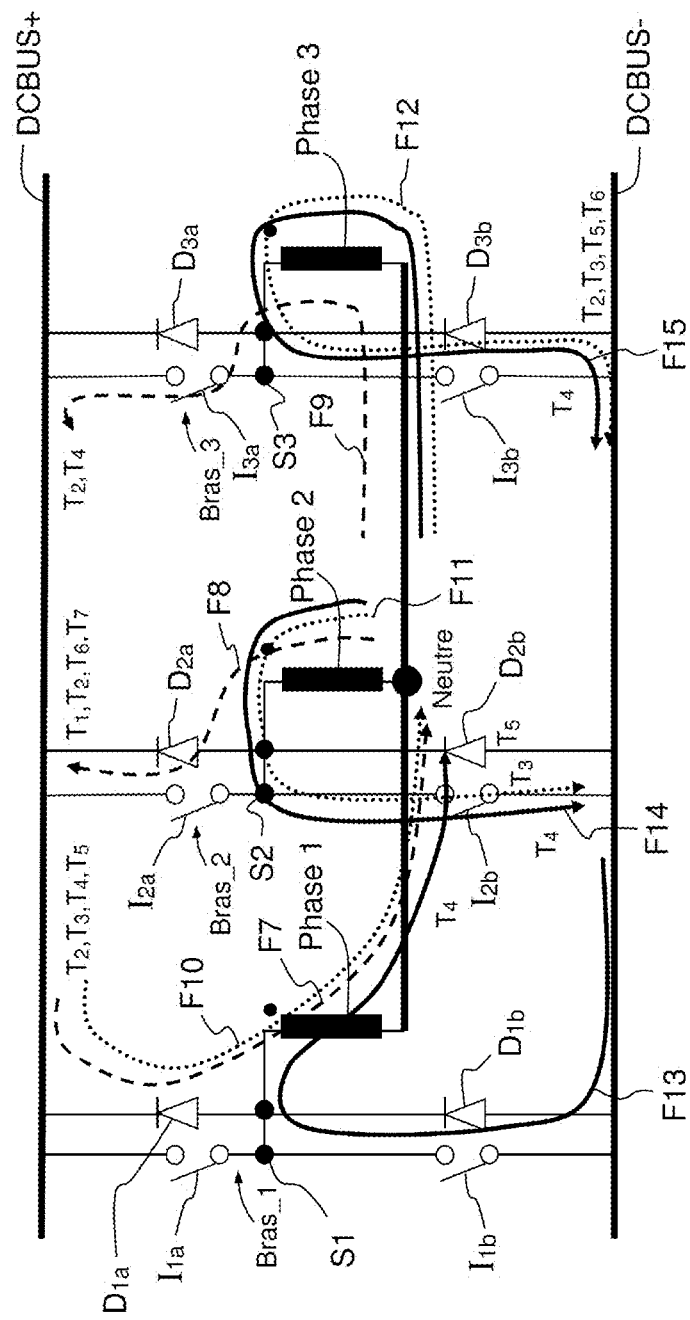
FIGS. 3a and 3b schematically illustrate the seven moments of a switching period of the electrical voltage in the operation of an inverter for an electrical receiver with three phases and neutral point.
Figure 3B:
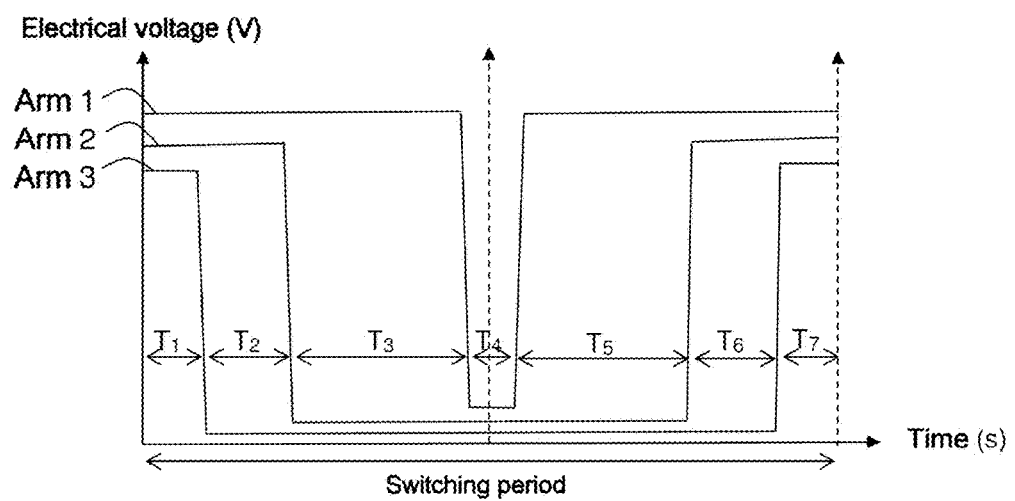

FIGS. 3a and 3b represent the seven moments of a switching period of the electrical voltage in the operation of an inverter with three arms for an electrical receiver such as an electric motor with three phases Phase1, Phase2, Phase3, and a neutral point Neutral.

FIG. 3a represents an inverter with three arms Arm_1, Arm_2 and Arm_3 comprising a positive electrical power supply DCBUS+ and a negative electrical power supply DCBUS−.

The first arm Arm_1 of the inverter comprises two switches $I_{1a}$, $I_{1b}$ and two diodes $D_{1a}$, $D_{1b}$, the second arm Arm_2 of the H bridge comprises two switches $I_{1a}$, $I_{2b}$ and two diodes $D_{2a}$, $D_{2b}$, and the third arm Arm_3 comprises two switches $I_{3a}$, $I_{3b}$ and two diodes $D_{3a}$, $D_{3b}$.

FIG. 3b represents seven successive moments $T_1$, $T_2$, $T_3$, $T_4$, $T_5$, $T_6$, and $T_7$ of a switching period of a positive phase electrical current in the inverter, for the electrical voltages measured respectively at the points S1, S2 and S3 relative to the DCBUS− power supply line of the three arms Arm_1, Arm_2, and Arm_3.

The operation of an inverter with M phases breaks down into 2M+1 periods, in this particular case in the case described, the operation of an inverter with three phases breaking down into seven moments or seven successive delays $T_1$, $T_2$, $T_3$, $T_4$, $T_5$, $T_6$, and $T_7$.

FIG. 3b below shows the operation of a three-phase inverter Phase1, Phase2, Phase3 with three arms Arm_1, Arm_2, and Arm_3 which comprises seven operating periods $T_1$, $T_2$, $T_3$, $T_4$, $T_5$, $T_6$, and $T_7$ (for the needs of the explanation, its operation is set at +15°, which leads to a distribution of the electrical currents in the respective proportions of +97%, −70% and −27% in its cosinusoidal three-phase reference frame).

The moments $T_1$ and $T_7$ correspond to the cases of the switches ha of the first arm Arm_1, $I_{2a}$ of the second arm Arm_2 and $I_{3a}$ of the third arm Arm_3 closed or active, in which the phase electrical currents are looped back through the positive power supply line DCBUS+, this time corresponds to a positive "freewheel" as illustrated by the arrows F7, F8 and F9.

The moments $T_2$ and $T_6$ correspond to the cases of the switches ha of the first arm Arm_1, $I_{2a}$ of the second arm Arm_2, and $I_{3b}$ of the third arm Arm_3 closed or active, in which the electrical current of the phase Phase3 is derived from the DCBUS+ power supply, this is a time during which the transfer of energy is applied while the electrical current of the phase Phase2 is still in positive "freewheel" mode; the electrical current of the phase Phase1 is the sum of the other two currents as illustrated by the arrows F10, F8 and F12.

The moments $T_3$ and $T_5$ correspond to the cases of the switches ha of the first arm Arm_1, $I_{2b}$ of the second arm Arm_2, and $I_{3b}$ of the third arm Arm_3 closed or active, in which the electrical currents of the phases Phase2 and Phase3 are derived from the DCBUS+ power supply, this is a time during which the transfer of energy is applied; the electrical current of the phase Phase1 is the sum of the other two electrical currents, as illustrated by the arrows F10, F11 and F12.

The moment $T_4$ corresponds to the case of the switches lib of the first arm Arm_1, $I_{2b}$ of the second arm Arm_2, and $I_{3b}$ of the third arm Arm_3 closed or active, in which the phase electrical currents of the phases Phase1, Phase2, Phase3 are looped back through the negative power supply line DCBUS−, this delay corresponds to a negative "freewheel", as illustrated by the arrows F13, F14 and F15.

As described above, the phase current passes, in turn, through the "top" and the "bottom" of the arms Arm_1 and Arm_2 with rise and fall times of the order of 1 A/ns. Also, the stray inductances distributed in the circuit generate overvoltages at a rate of 1 volt/nH. These stray inductances are distributed in the inverter arms but also in the "DCBUS" links.

Given that a single wire develops 10 nH/cm, without precautions, an inverter half-arm of 15 cm is the seat of overvoltages of the order of 150 V, in other words, more than half of the aeronautic voltage (270 V dc), even the entirety of the power supply voltage for some launch vehicle applications (Ariane 5ME and Ariane 6, top stage: 150 V).

These overvoltages require the components to be oversized and the production technologies of the equipment to also withstand the rate of charge in the components that they generate.

For example, an inverter powered by 320 V batteries can be produced with 650V chips, with a surface area of 100 mm² for the IGBTs and of 38 mm² for the diodes. When the overvoltages require the use of components with a higher voltage withstand strength, 1200 V chips must be used; the withstand strength to a higher voltage means having thicker chips. Now, the diodes, just like the IGBTs, conduct the current in the thickness of the chip so that, to conserve the same conduction losses, the surface area of the IGBT changes to 193 mm² and that of the diode to 81 mm².

Currently, the market does not offer catalogue-available hybrid modules, of high reliability, even of industrial grade, which incorporate tolerance to failures by redundancy.

It is thus necessary to construct a discrete solution which, intrinsically, would be neither extremely compact and therefore subject to the overvoltages, nor thermally optimized and therefore oversized, i.e. develop a specific hybrid circuit which will make it possible to exploit all the advantages of this invention.

The present invention implements the minimum of redundancy of the power components necessary to resolve the problem of tolerance to failures without reconfiguration.

Through the optimisation of the redundancy, the present invention makes it possible to define a compact implementation which, by drastically reducing the stray inductances, enhances the performance levels of the inverter while reducing the switching overvoltages thereof.

The proposed architecture is applied to motors with at least three phases, controlled by H bridges; it is based on the following three observations:
- the polyphase motors with n phases, controlled by the vector control technique (Park, Concordia transforms), have the facility to be able to operate naturally on n−1 phases when the failed phase is lost by open circuit;
- no failure mode can short-circuit the battery without risking a failure propagation; and
- the loss of a freewheeling diode causes the inductance of the corresponding phase of the motor to develop a voltage that risks propagating the failure.

On this basis, the tolerance to simple failure of the proposed solution relies on two means:
the power switches are redundant in series.

Thus, an open-circuit failure of a switch corresponds to an open phase, which is acceptable, and a short-circuit failure is circumvented by the series redundancy, which is required. Furthermore, a short-circuit failure of a switch does not cause a short-circuit of the battery, or of the phase of the motor, which is required.

The power diodes are redundant in series and parallel.

Thus, an open-circuit failure of a diode is compensated by the parallel diode, which is required, and a short-circuit failure is circumvented by the series redundancy, which is required. Furthermore, the short-circuit failure of a diode does not cause a short-circuit of the battery, or of the phase of the motor, which is required.

All the ideas developed in the present invention are applicable to the inverters produced with discrete components, but, the implementation of the present invention in a power hybrid makes it possible to derive maximum benefit from the stray inductance reduction techniques by virtue of the multiplying effect of the increased compactness of the solution through hybridization.

Also, the grouping together or the separation of the power components according to their negative or positive temperature coefficient makes it possible to optimise the division of the current between the components.

Figure 4A:
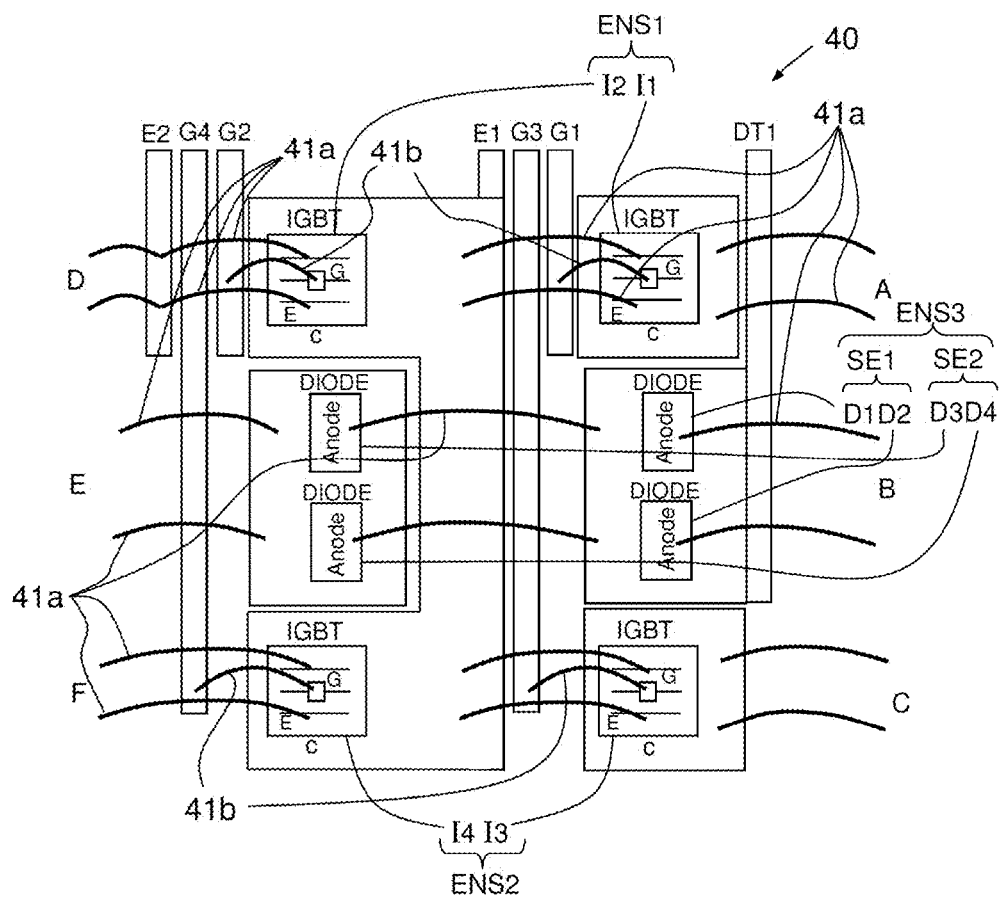
FIGS. 4a and 4b respectively illustrate a detailed and synthetic half-arm of a switched-mode power converter, when P=2, M=2, $N_1$=2, and $N_2$=2, according to one aspect of the invention.
Figure 4B:
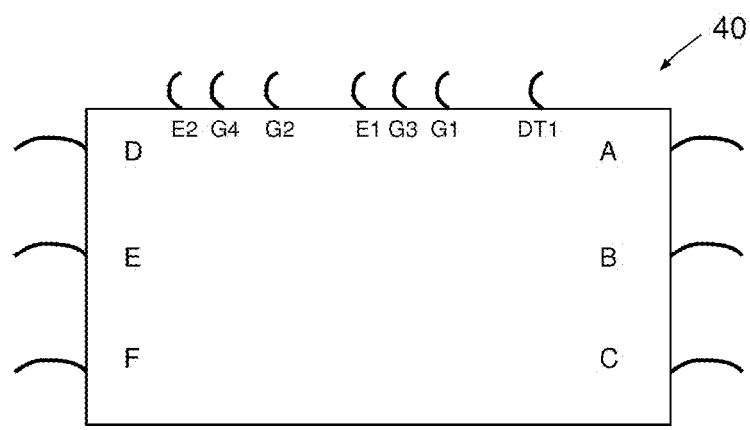

FIGS. 4a and 4b respectively illustrate a detailed half-arm 4a and a synthetic half-arm 4b of a switched-mode power converter, when P=2, M=2, $N_1=2$, and $N_2=2$, like an inverter, a chopper, or a dimmer, configured to control at least one phase of a polyphase electrical receiver with at least three phases, such as an electric motor or a transformer, comprising at least two converter arms. This embodiment is in no way limiting.

The switches can comprise at least one insulated gate bipolar transistor or IGBT, and/or at least one insulated gate field-effect transistor or MOSFET, which stands for "Metal Oxide Semiconductor Field Effect Transistor". In the examples described, the switches are insulated gate bipolar transistors or IGBT, in a nonlimiting manner.

FIG. 4a shows a detailed representation of a half-arm 40 of a switched-mode power converter, when P=2, M=2, $N_1=2$ and $N_2=2$.

Such a half-arm 40 of a switched-mode power converter arm comprises a first set ENS1 of P≥2 switches in series, in this case two switches I1, I2 arranged in series, a second set ENS2 of P≥2 switches in series, in this case two switches I3, I4, arranged in series, and a third set ENS3 of diodes, arranged between the first set ENS1 and the second set ENS2, comprising M≥2 subsets SE1, SE2, . . . SEM, indexed i∈[[1; M]], in this case two subsets SE1, SE2 in series, respectively comprising $N_i≥2$ diodes in parallel, in this case, respectively, two diodes in parallel, D1 and D2, and D3 and D4.

The various connections are represented by connection wires 41a, and represented by low-level connection wires 41b.

The emitter connections E1, E2 of the switches I1, I2, I3, I4 are used as return for the control of the switches I1, I2, I3, I4.

The gate connections G1, G2, G3, G4 of the transistor switches I1, I2, I3, I4 are used for the control of the switches I1, I2, I3, I4.

The mid-point DT1 of the series connection of the subsets SE1, SE2 of diodes can be used for self-testing.

The external connections of this half-arm 40 are referenced A, B, C, D, E and F, in order to be able to identify them in the following summary representations.

FIG. 4b is a summary version of FIG. 4a.

One of the main characteristics of the diodes is their negative temperature coefficient. That means that the forward voltage recorded at the terminals of a diode past through by a given electrical current decreases as the temperature of the diode increases.

In the case of a parallel diode connection, the division of the electrical current between them depends on their individual current/voltage characteristic. If a temperature difference occurs between the diodes, the hottest diodes are passed through by a greater current which, in return, further heats up said diodes with the possibility of a runaway.

Also, the proposed implementation prescribes grouping together the diodes in parallel on the same copper surface so that, when one diode heats up, it also heats up the other diodes, thus tending to maintain the good distribution of the current.

Unlike the diodes, one of the main characteristics of the IGBTs or switches is their positive temperature coefficient. That means that the electrical voltage between the collector and the emitter recorded at the terminals of a saturated IGBT, passed through by a given collector current, increases as the temperature of the IGBT increases.

Just as for the diodes, in the case of a parallel IGBT connection, the division of the current between them depends on their individual current/voltage characteristic. By contrast, if a temperature difference occurs between the IGBTs, the hottest IGBTs are passed through by a lower current which, in return heats up said IGBTs less which makes it possible, if each IGBT can have its temperature changed freely, to stabilise the division of the current between the IGBTs.

Also, the proposed implementation prescribes dissociating the IGBTs in parallel on different and separate copper surfaces, so that, in the case where one IGBT heats up, the thermal segregation with the other IGBTs allows it to heat up freely, without interfering with the other IGBTs, thus tending to maintain the good distribution of the current.

It should be noted here that the substrate used is composed of a layer of copper, on which the chips are soldered, resting on a ceramic of alumina type which is mounted on a second layer of copper in direct or indirect contact with a heat sink. Through the presence of the ceramic which has a higher thermal resistance than that of the top copper face in the stack of the power hybrid, the thermal power is preferentially in all the top copper surface (horizontally), which causes the heating of the other elements common to this copper layer and which is, specifically, the effect sought for the diodes.

By contrast, since the interfaces below the ceramic are good thermal conductors, the heat is transmitted substantially equally horizontally and vertically in the ceramic so that, from a distance equal to the thickness of the ceramic, there will be no "thermal crosstalk"; which is the effect sought for the IGBTs. As indicated previously, the phase current is switched between diodes and power switches so, since the rate of variation of the current is rapid, the lesser stray inductance generates the lesser switching over voltages.

Figure 4C:
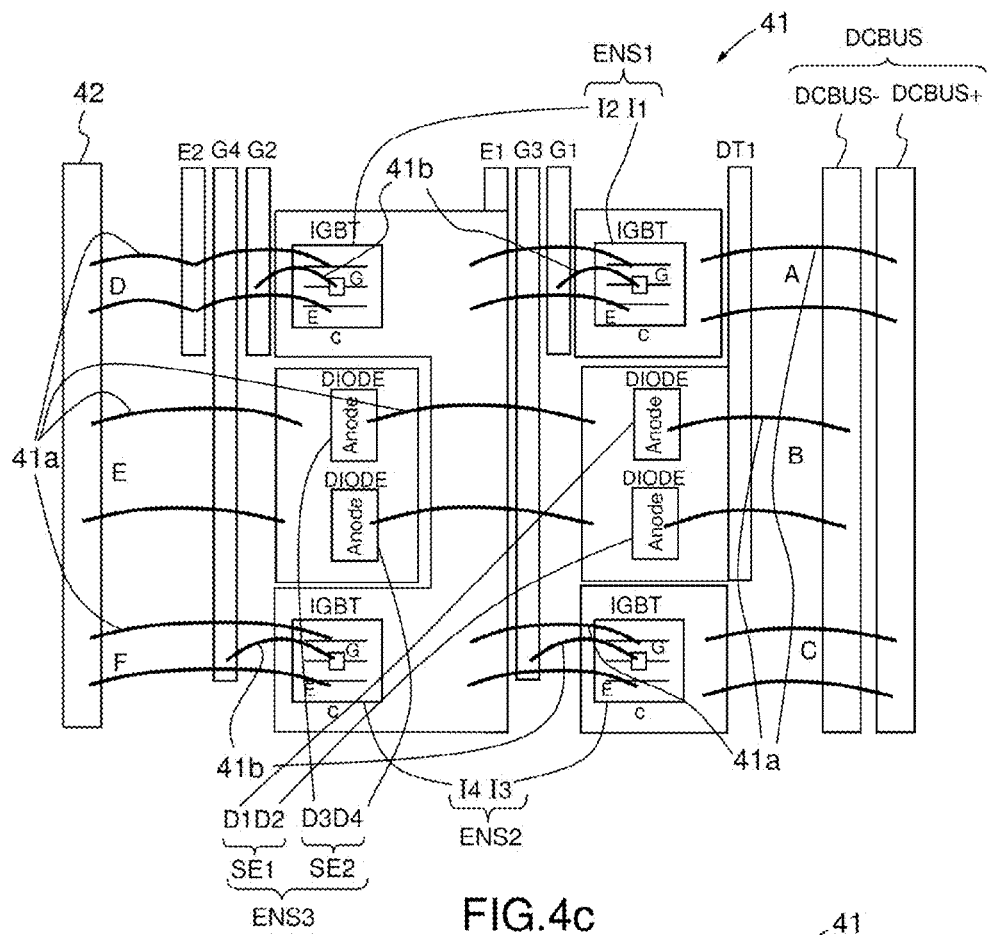
FIGS. 4c, 4d, 4e, 4f, 4g, 4h, 4i and 4j illustrate, alternatively in detail and schematically, a half-arm of a switched-mode power converter, when P=2, M=2, $N_1$=2, and $N_2$=2, according to various aspects of the invention.

In the case of a positive current, the phase current is switched respectively between the groups ENS1 and ENS2, on the one hand, and the group ENS3, for the output 42 in FIG. 4C.

The present invention prescribes:
assembling the group of diodes connected in parallel on a single surface; and
placing the group of diodes in the middle of the group of switches which is split into two branches in which the current is distributed. The rest of the scheme being implemented according to the same principle.

The phase current circulates either in the central branch composed of the group of diodes ENS3, or, is divided up between the two branches of IGBTs ENS1, ENS2.

The strong mutual inductive coupling of the branch ENS3 with diodes on cells ENS1, ENS2 with IGBTs (and vice versa), renders the switching inductance very low, which is the aim sought.

The principles set out previously make it possible to design a circuit allowing for a powerful optimisation of the design of a power hybrid.

During switching, in so-called freewheel phases, the currents are exchanged between the inverter arms of the H bridge through the power supply lines.

According to the stray inductance of these lines, overvoltages are generated at the terminals of the active components.

The present invention proposes placing the inverter arms back-to-back, so that the exchanges of current between the two inverter arms are as direct as possible, therefore with the least possible inductance.

FIGS. 4c, 4d, 4e, 4f, 4g, 4h, 4i and 4j illustrate, alternatively in detail and schematically, a half-arm of a switched-mode power converter, when P=2, M=2, $N_1$=2, and $N_2$=2, such as an inverter, a chopper, or a dimmer, configured to control at least one phase of a polyphase electrical receiver with at least three phases, such as an electric motor or a transformer, comprising at least two converter arms, according to various aspects of the invention.

These figures illustrate a half-arm 40 of FIGS. 4a and 4b, connected in various ways with power interfaces and a coplanar electrical power supply DCBUS.

FIG. 4c represents a positive half-arm 41 of a switched-mode power converter, when P=2, M=2, $N_1$=2 and $N_2$=2, for a positive use, i.e. in which the first and second sets ENS1, ENS2 are connected to a positive power supply line DCBUS+, in a left hand implementation.

Such a positive half-arm 41 comprises a half-arm 40 whose first and second sets ENS1, ENS2 are connected to a positive power supply line DCBUS+ of a coplanar electrical power supply DCBUS, comprising a positive line DCBUS+ and a negative line DCBUS−, arranged so as to separate two arms of the converter, and comprising a power interface for each arm, such as a busbar or distribution bar.

Each power interface is arranged such that the two half-arms of the corresponding arm are situated between the coplanar electrical power supply DCBUS and the corresponding power interface. The different connections are represented by connection wires 41a and represented by low-level connection wires 41b.

In the present implementation of a half-arm, the power interface or phase output 42 is represented on the left.

Figure 4D:
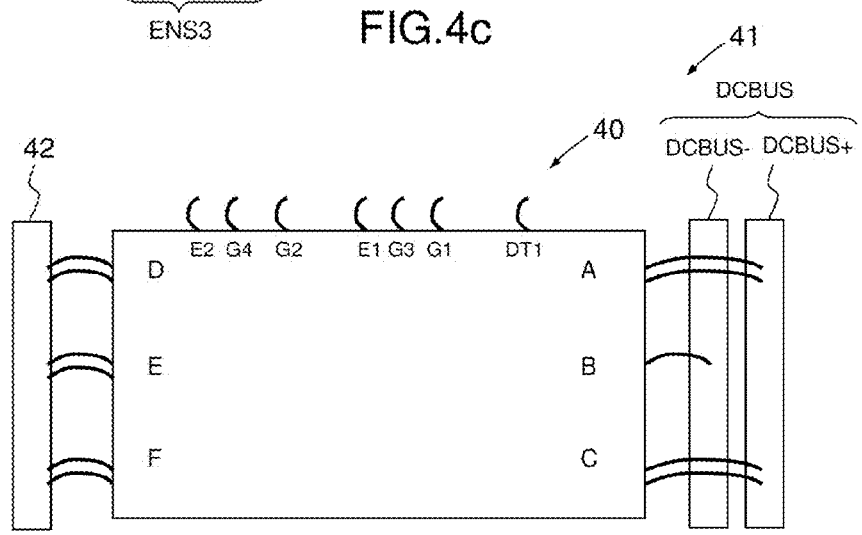

FIG. 4d is a summary version of FIG. 4c.

Figure 4E:
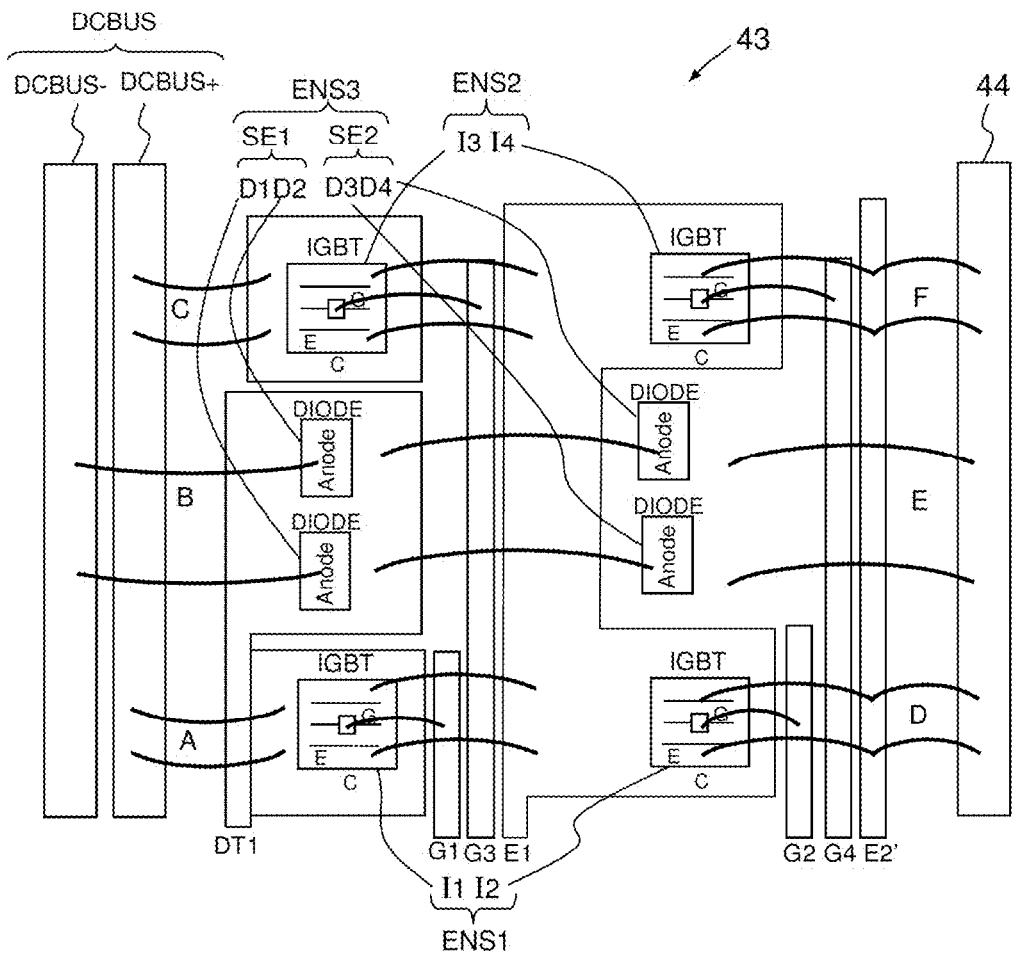

FIG. 4e represents a positive half-arm 43 of a switched-mode power converter, when P=2, M=2, $N_1$=2 and $N_2$=2, for a positive use, i.e. in which the first and second sets ENS1, ENS2, are connected to a positive power supply DCBUS+, in a right hand implementation.

Such a positive half-arm 43 comprises a half-arm 40 whose first and second sets ENS1, ENS2 are connected to the positive line DCBUS+ of a coplanar electrical power supply DCBUS, comprising a positive line DCBUS+ and a negative line DCBUS−, arranged so as to separate two arms of the converter, and comprising a power interface for each arm, such as a busbar or distribution bar.

Each power interface is arranged such that the two half-arms of the corresponding arm are situated between the coplanar electrical power supply DCBUS and the corresponding power interface. The various connections are represented by connection wires 41a, and represented by low-level connection wires 41b.

In the present implementation of a half-arm, the power interface 44 is represented on the right.

Figure 4F:
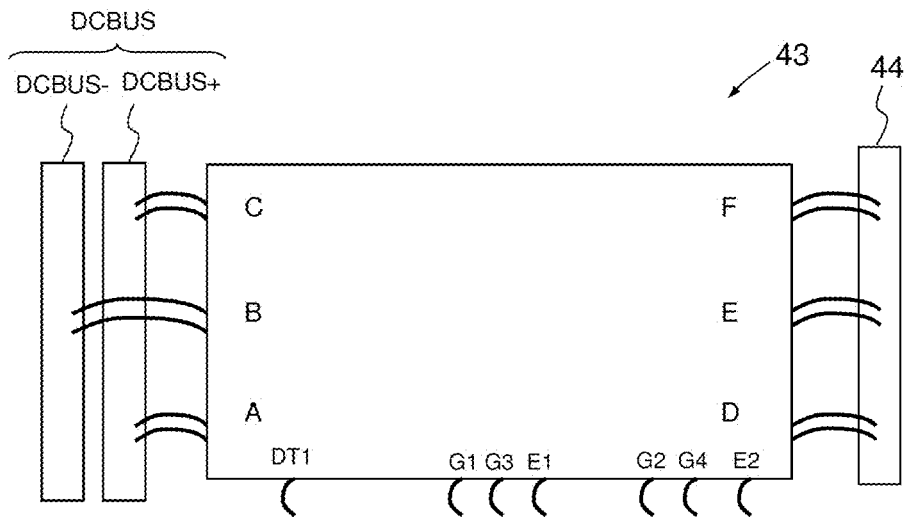

FIG. 4f is a summary version of FIG. 4e.

Figure 4G:
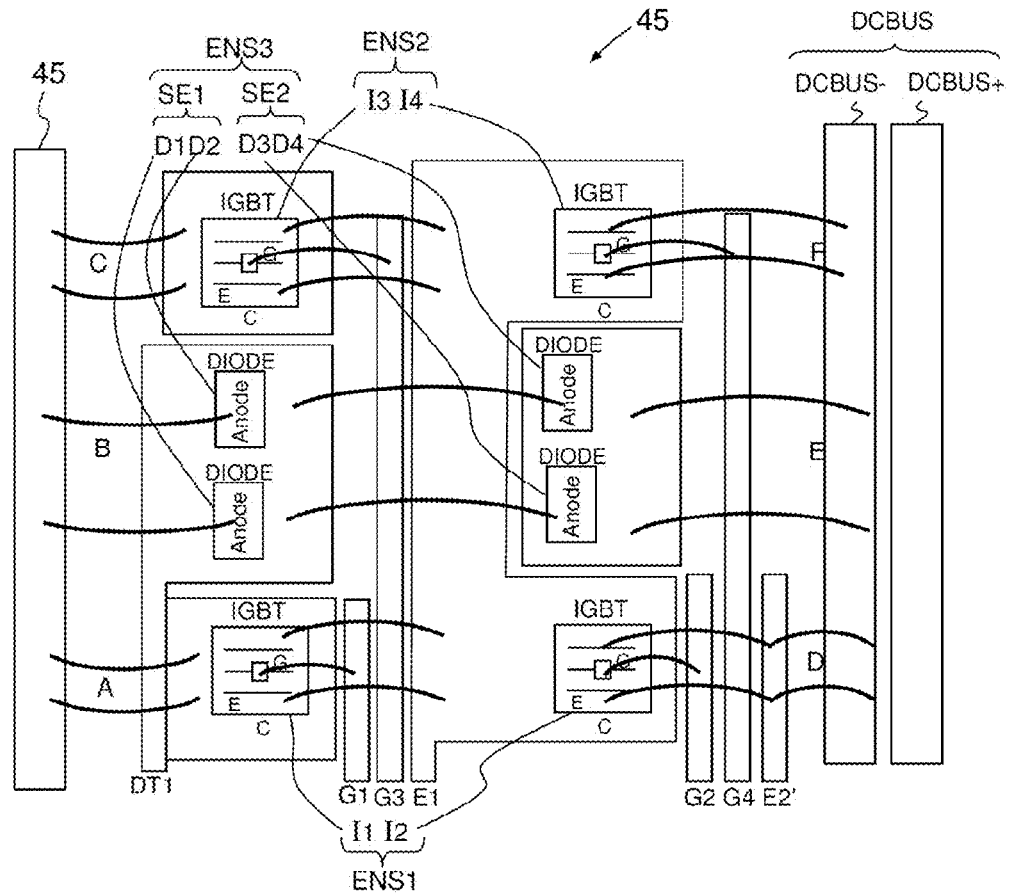

FIG. 4g represents a negative half-arm 45 of a switched-mode power converter, when P=2, M=2, $N_1$=2 and $N_2$=2, for a negative use, i.e. in which the first and second sets ENS1, ENS2 are connected to a negative power supply line DCBUS−, in a left hand implementation.

Such a negative half-arm 45 comprises a half-arm 40 whose first and second sets ENS1, ENS2 are connected to a negative power supply line DCBUS− of a coplanar electrical power supply DCBUS, comprising a positive line DCBUS+ and a negative line DCBUS−, arranged so as to separate two arms of the converter, and comprising a power interface for each arm, such as a busbar or distribution bar.

Each power interface is arranged such that the two half-arms of the corresponding arm are situated between the coplanar electrical power supply DCBUS and the corresponding power interface. The various connections are represented by connection wires 41a, and represented by low-level connection wires 41b.

In the present implementation of a half-arm, the power interface or phase output 46 is represented on the left.

Figure 4H:
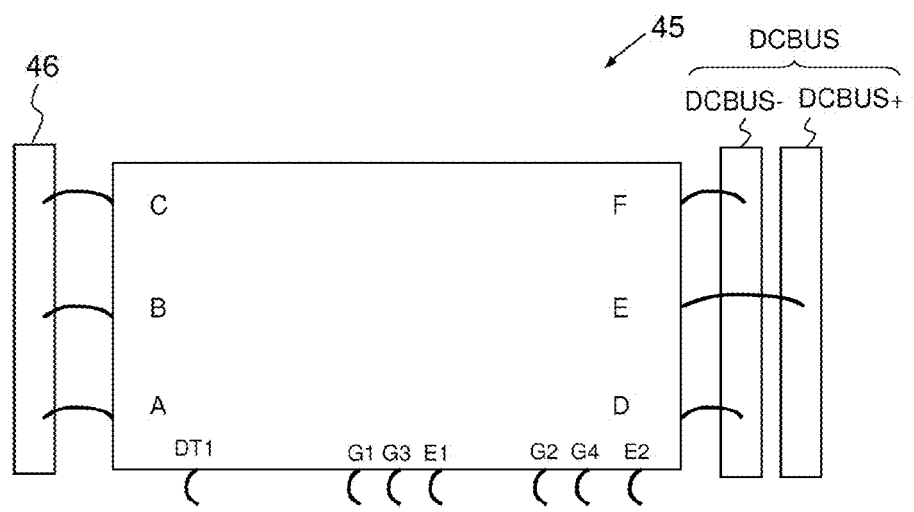

FIG. 4h is a summary version of FIG. 4g.

Figure 4I:
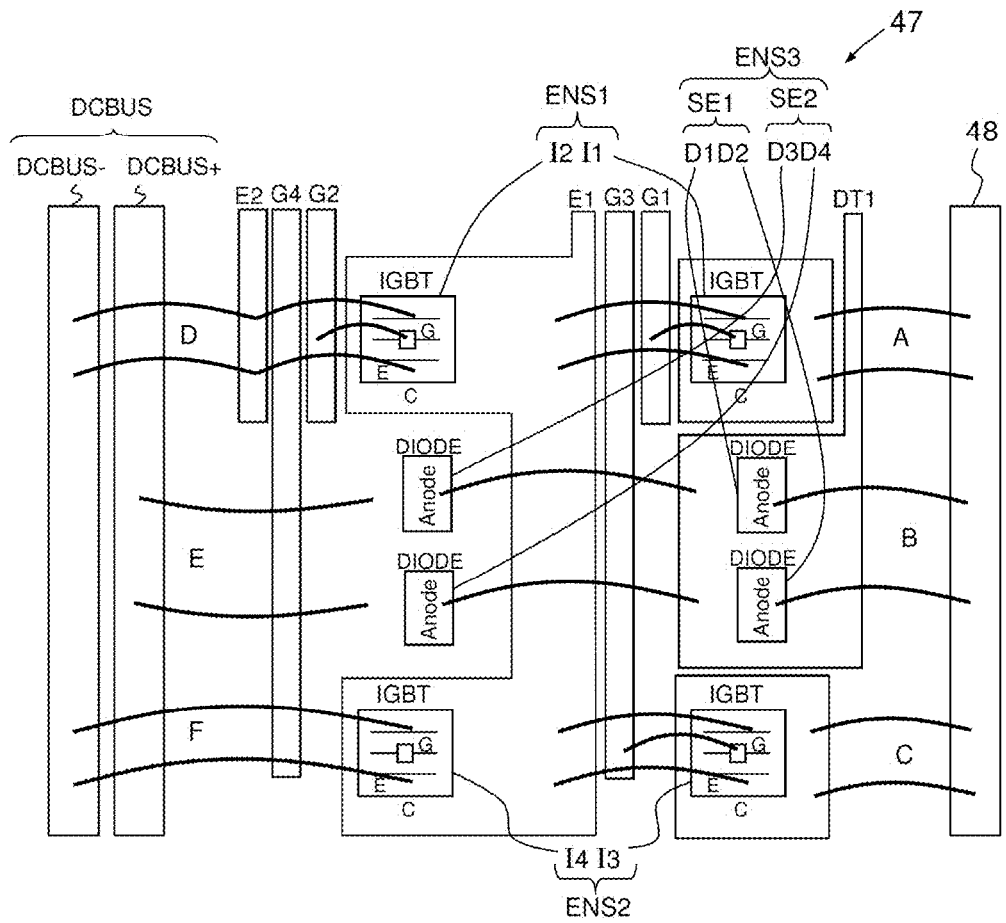

FIG. 4i represents a negative half-arm 47 of a switched-mode power converter, when P=2, M=2, $N_1$=2 and $N_2$=2, for a negative use, i.e. in which the first and second sets ENS1 and ENS2 are connected to a negative power supply line DCBUS−, in a right hand implementation.

Such a negative half-arm 47 comprises a half-arm 40 whose first and second sets ENS1, ENS2 are connected to the negative line DCBUS− of a coplanar electrical power supply DCBUS, comprising a positive line DCBUS+ and a negative line DCBUS−, arranged so as to separate two arms of the converter, and comprising a power interface for each arm, such as a busbar or distribution bar.

Each power interface is arranged such that the two half-arms of the corresponding arm are situated between the coplanar electrical power supply DCBUS and the corresponding power interface. The various connections are represented by connection wires 41*a*, and represented by low-level connection wires 41*b*.

In the present implementation of a half-arm, the power interface 48 is represented on the right.

FIG. 4*f* is a summary version of FIG. 4*e*.

For the following figures, for representation purposes, only summary versions are used.

Figure 5A:
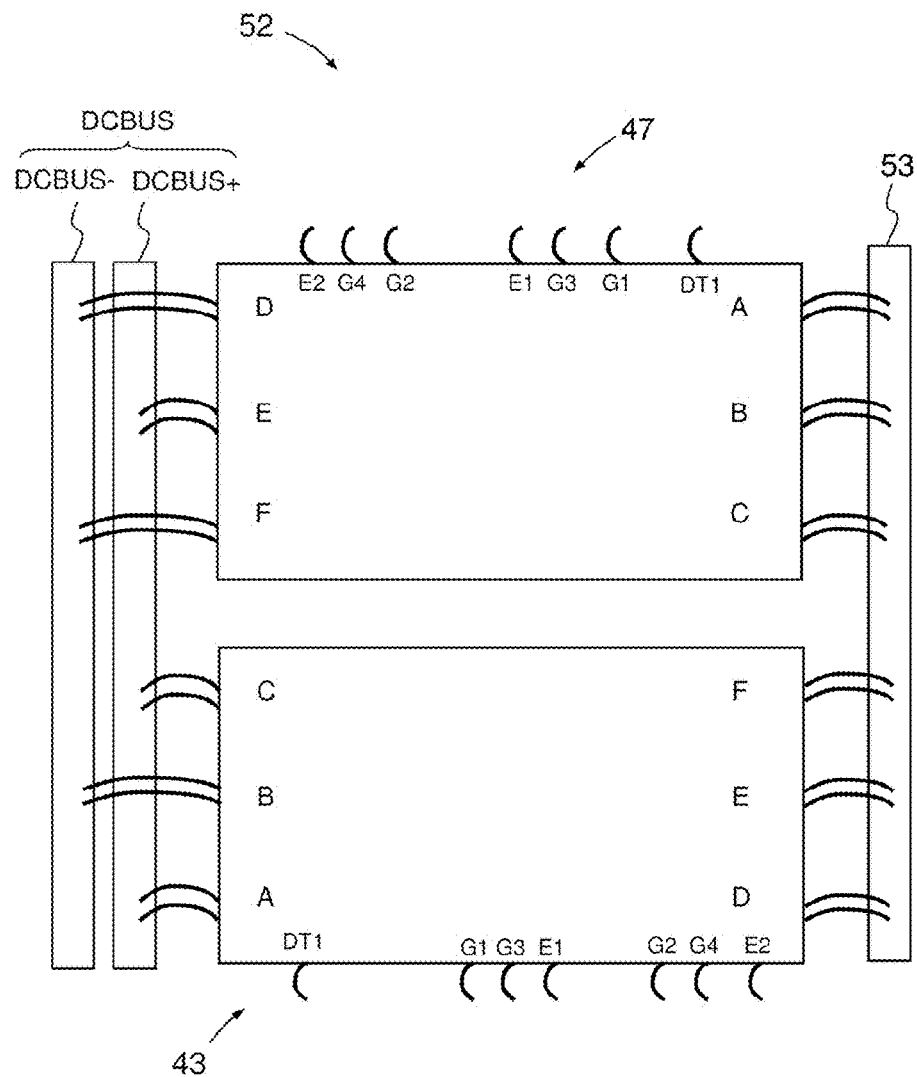
FIGS. 5a and 5b represent an arm of a switched-mode power converter, when P=2, M=2, $N_1$=2, and $N_2$=2.
Figure 5B:
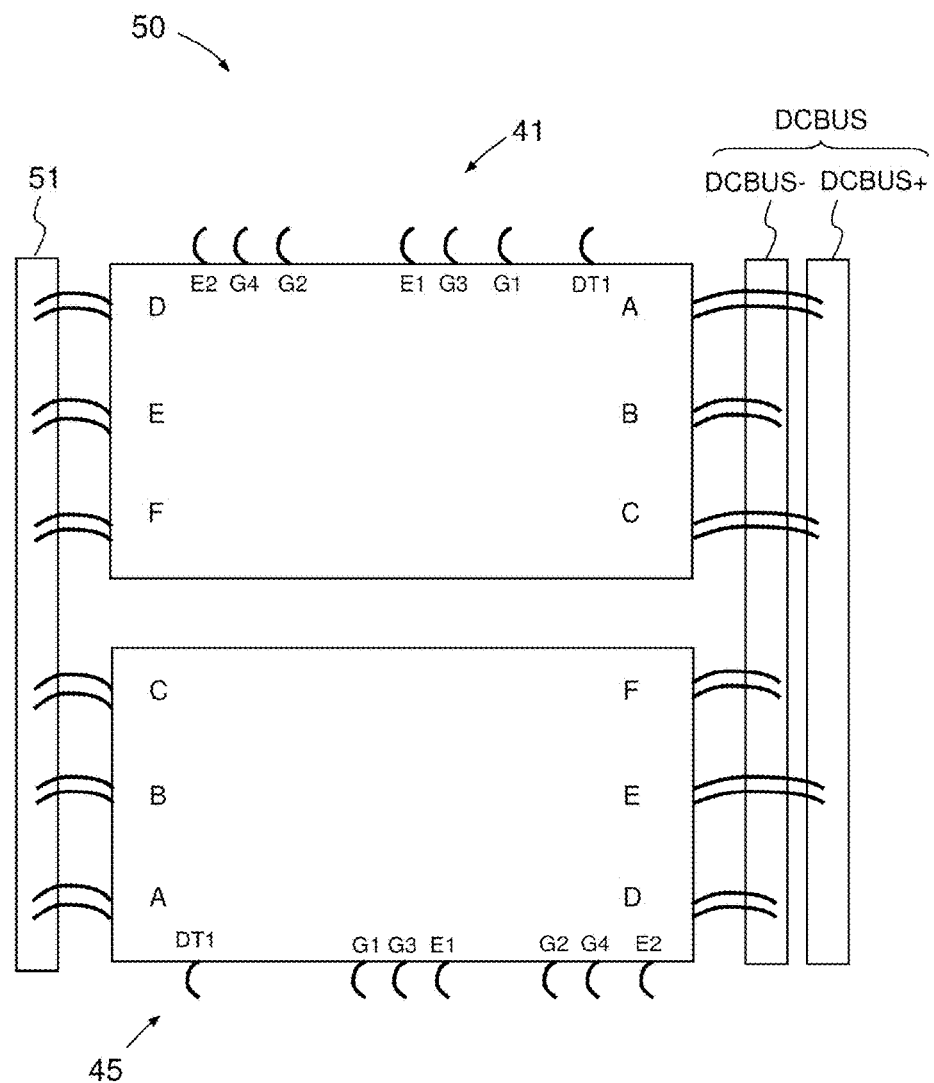
Figure 5C:
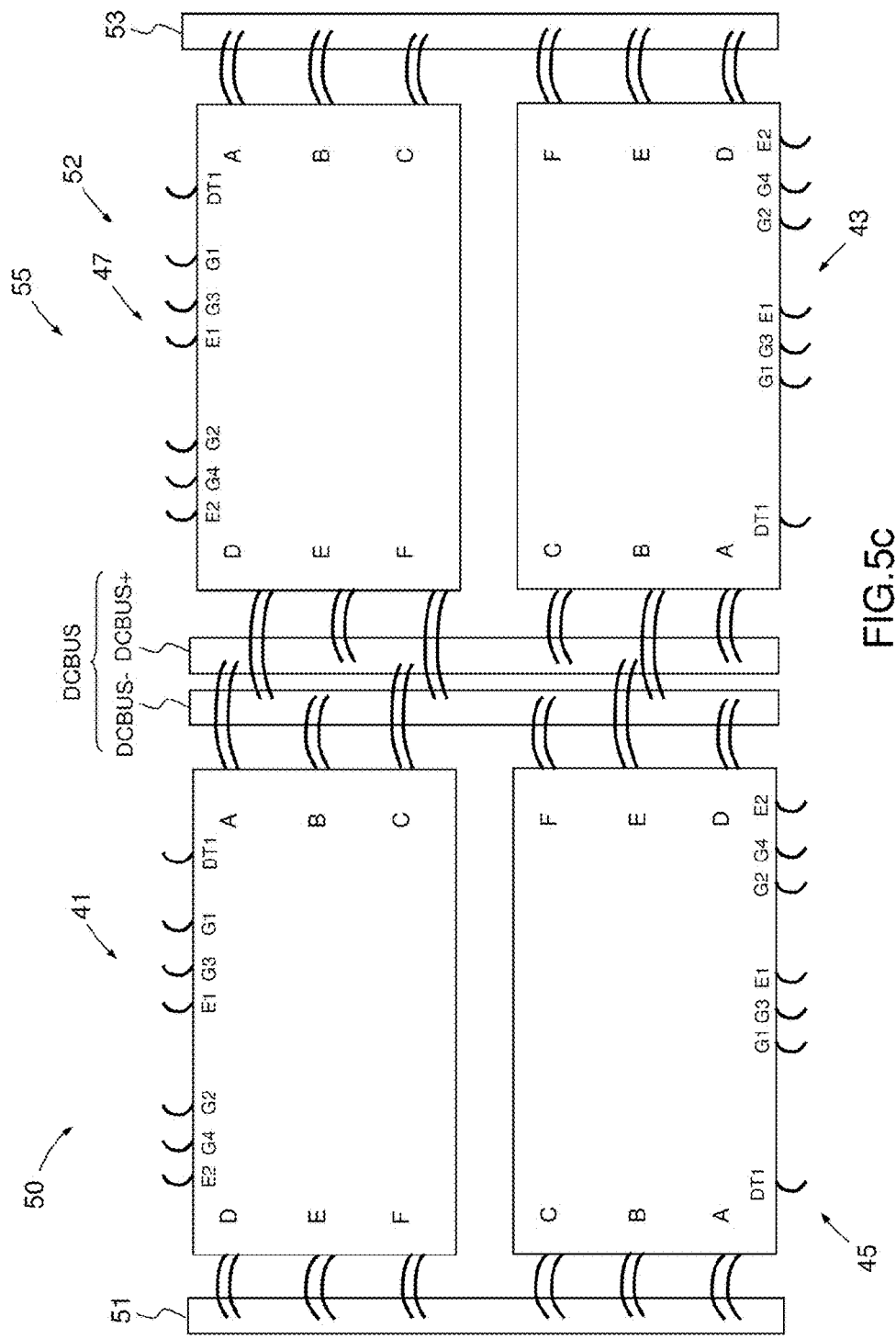
FIG. 5c represents a block of two arms, that can for example be used as H bridge or as double arm of a switched-mode power converter, when P=2, M=2, $N_1$=2, and $N_2$=2 according to aspects of the invention.

FIGS. 5*a* and 5*b* represent, in detail and in summary form, an arm of a switched-mode power converter with P=2, M=2, $N_1$=2 and $N_2$=2, and FIG. 5*c* represents a block of two arms that can for example be used as H bridge or as double-arm of a switched-mode power converter, according to one aspect of the invention.

FIG. 5*b* represents an arm 50 of a switched-mode power converter with P=2, M=2, $N_1$=2 and $N_2$=2 with left-hand implementation, which is composed of two half-arms 41, 45, one of them 41, the positive half-arm, according to FIG. 4*c* or 4*d* and the other, 45, the negative half-arm, according to FIG. 4*g* or 4*h*. The power interface DCBUS corresponds to the power interfaces 42 or 46, in this case identical.

Figure 4J:
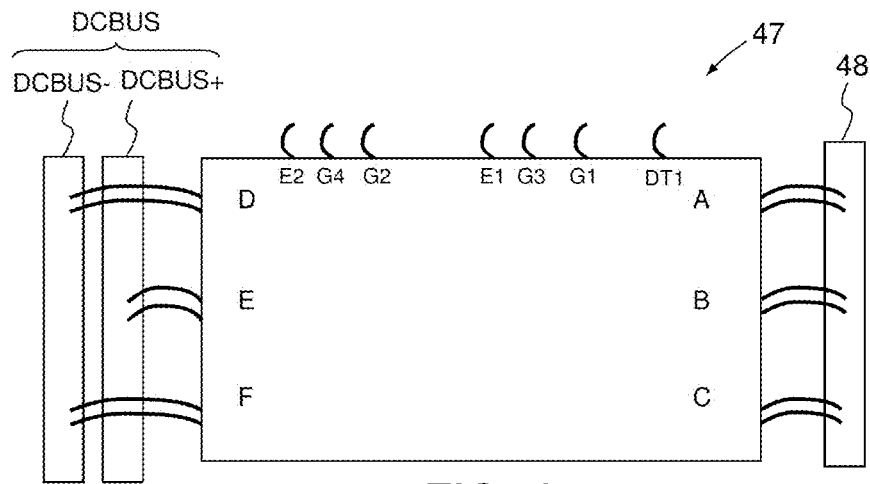

FIG. 5*a* represents an arm 52 of a switched-mode power converter with P=2, M=2, $N_1$=2 and $N_2$=2 with right hand implementation, which is composed of two half-arms 47, 43, one of them, 43, the positive half-arm, according to FIG. 4*d* or 4*e*, and the other, 47, the negative half-arm, according to FIG. 4*i* or 4*j*. The power interface 53 corresponds to the power interfaces 44 or 48, in this case identical.

FIG. 5*c* represents a block 55 of two arms 50, 52, being the combination of an arm 50 implemented on the left according to FIG. 5*b* and an arm 52 implemented on the right according to FIG. 5*a*, that can for example be used as H bridge or as double-arm of a switched-mode power converter, according to one aspect of the invention. Obviously, all these embodiments are nonlimiting, because they can be adapted to different geometries.

Figure 6B:
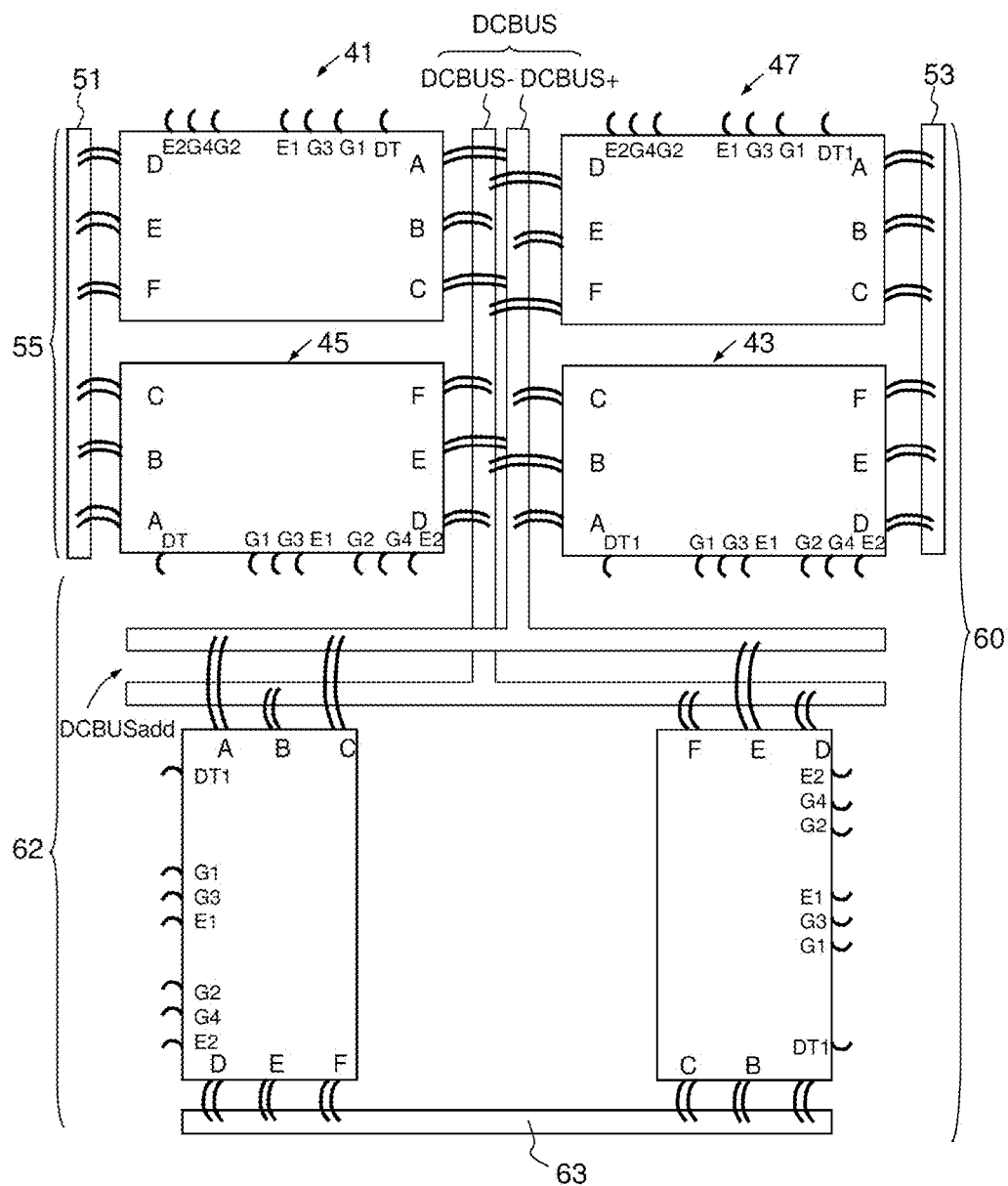

FIGS. 6*a* and 6*b* represent examples of production of a block 60 comprising a block 55 of two arms according to FIG. 5*c*, provided with an additional arm 57, 62 for an odd total number of arms, according to two nonlimiting embodiments.

The embodiment of FIG. 6*a* represents a block 60 comprising a block 55 of two arms, according to FIG. 5*c*, provided with an additional arm 57 comprising two half-arms 57*a*, 57*b* arranged on either side of the extended coplanar electrical power supply DCBUS. In the embodiment, the additional arm 57 comprises a negative half-arm with left hand implementation 57*a* and a positive half-arm with right hand implementation 57*b*. The additional arm 57 further comprises a power interface 58 comprising, respectively, for each of the two half-arms 57*a*, 57*b*, a part 58*a*, 58*b* arranged such that the corresponding half-arm 57*a*, 57*b* is situated between the coplanar electrical power supply DCBUS and the corresponding part of the power interface, or, in other words, the extension of the power interface 58*a*, 58*b*. In this case, the power interface 58 of the additional arm 57 therefore comprises three parts 58*a*, 58*b* and 58*c* forming a U.

The embodiment of FIG. 6*b* represents a block 60 comprising a block 55 of two arms, according to FIG. 5*c*, provided with an additional arm 62. The block 60 further comprises an additional portion DCBUSadd of coplanar electrical power supply arranged at one end and in a different direction from the rest of the coplanar electrical power supply DCBUS, and a power interface 63 of the additional arm 62 arranged such that the additional arm 62 is situated between said additional portion DCBUSadd of coplanar electrical power supply and said corresponding power interface 63.

The additional portion DCBUSadd of coplanar electrical power supply can advantageously be substantially at right angles to the rest of the coplanar electrical power supply DCBUS.

In this case, the coplanar electrical power supply DCBUS, DCBUSadd form an upside down T.

During switching, in the so-called "freewheel" phases, the currents are exchanged between the inverter arms of the H bridge through the power supply lines DCBUS+, DCBUS−. Depending on the stray inductance of these lines, overvoltages will be generated therein.

The present invention proposes placing the inverter arms back-to-back, so that the exchanges of currents between the two inverter arms are as direct as possible, therefore with the least possible induction.

Figure 7A:
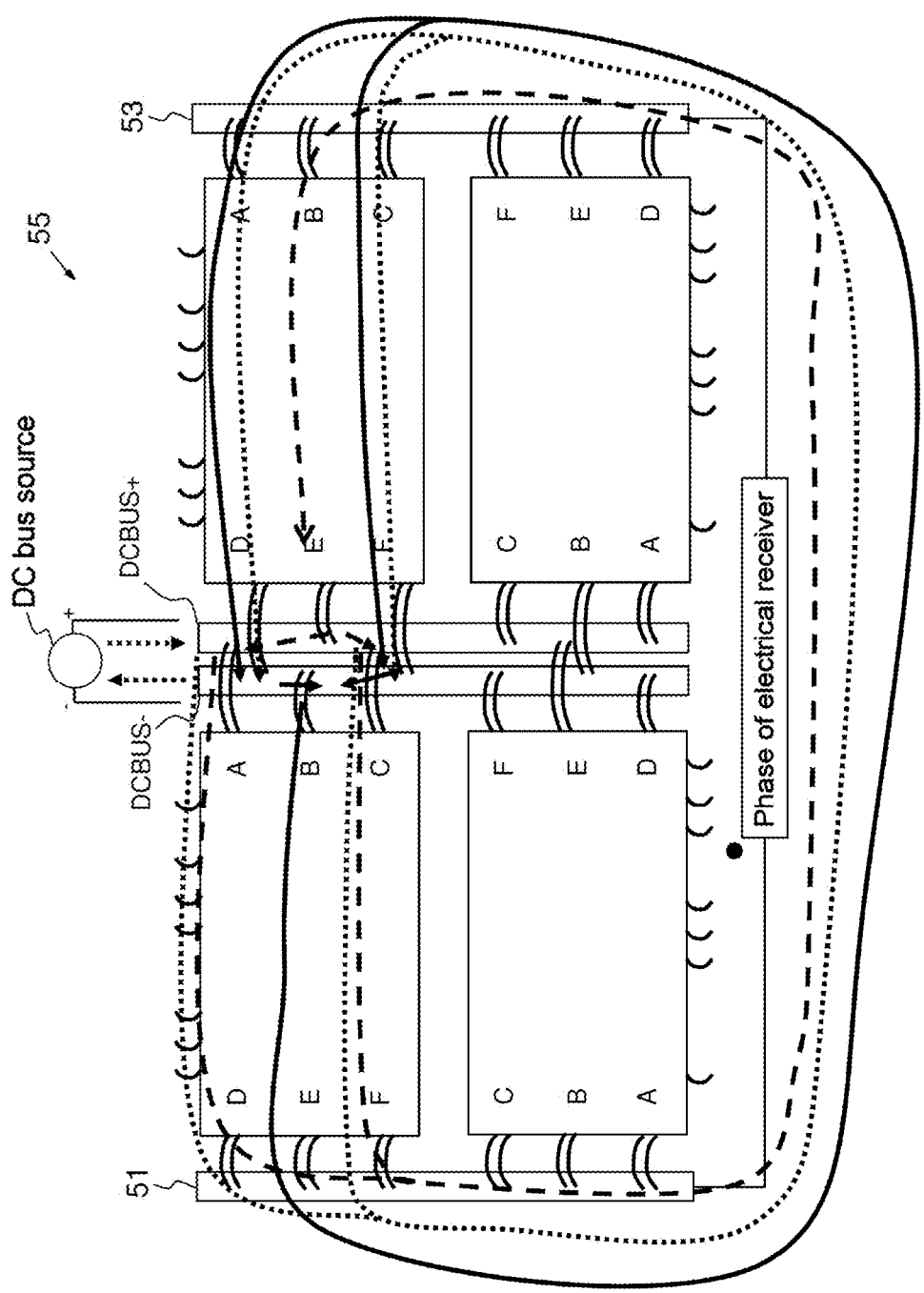

FIG. 7*a* illustrates the circulations of the electrical currents in a block 55 of two arms used as H bridge for an electrical receiver phase Phase, in the case of a positive phase electrical current.

For the "freewheel" in the positive power supply bar DCBUS+, the current follows the path indicated by the broken line arrows.

For the "freewheel" in the negative power supply bar DCBUS−, the current follows the path indicated by the solid or continuous line arrows.

The dotted line arrows indicate the circulation of the current, during the active period. During this period, the current is derived from the DCBUS source at the voltage $V_{DCBUS}$, which corresponds to the energy delivered by the source to the phase.

FIG. 7*b* illustrates the circulations of the electrical currents in a block 55 of two arms used as H bridge for an electrical receiver phase Phase, in the case of a negative phase electrical current.

For the "freewheel" in the positive power supply bar, the current follows the path indicated by the dotted line arrows.

For the "freewheel" in the negative power supply bar, the current follows the path indicated by the solid or continuous line arrows.

The dotted line arrows indicate the circulation of the current, during the active period. During this period, the current is derived from the DCBUS source at the voltage $V_{DCBUS}$, which corresponds to the energy delivered by the source to the phase.

Figure 8A:
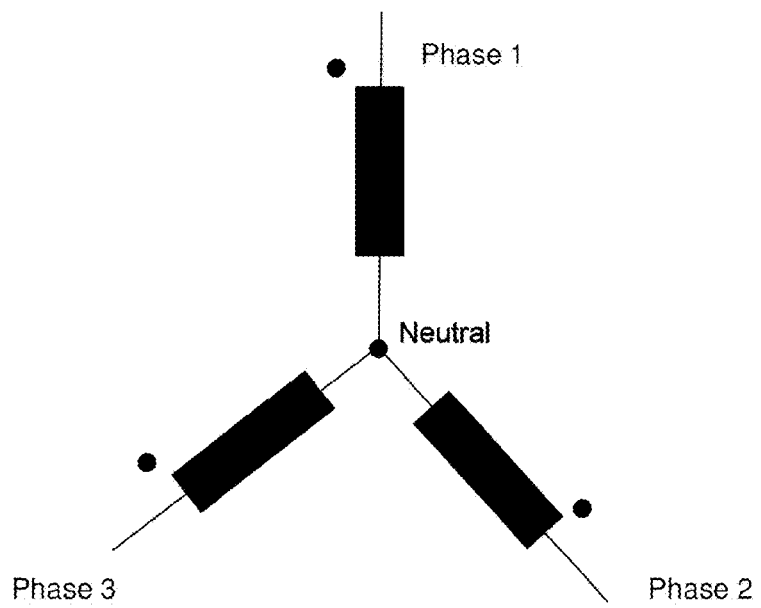
FIG. 8a illustrates the case of an odd number of phases, in this case three phases and a neutral of the electrical receiver.
Figure 8B:
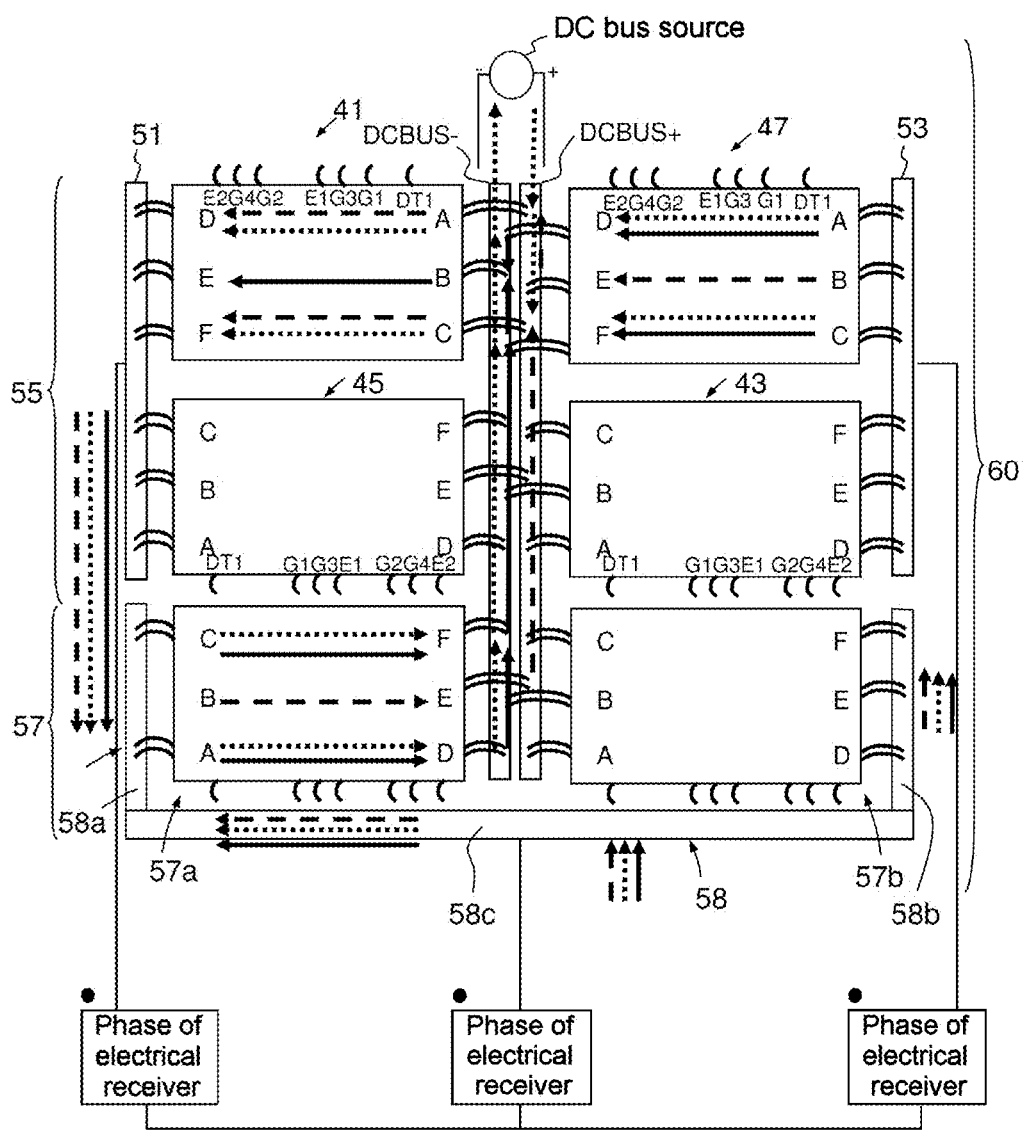
FIGS. 8b and 8c illustrate the circulations of the electrical currents in a block of FIGS. 6a and 6b with an electrical receiver with three phases and neutral.

FIG. 8*b* illustrates the case of an odd number (2M+1) of phases of the electrical receiver, in this case three phases Phase1, Phase2, Phase3, and a neutral of the electrical receiver.

The electrical receiver, for example the electric motor revolving over 360°, each phase (taking the three-phase case) is phase-shifted by 120° but each phase sees a current of type I=Io cos (ωt+θ) in which θ is respectively 0, 120° and 240°.

Noteworthy angles (every 60°) can be found that follow the table of FIG. 8*a*, so it is possible to more easily study the circulation of the switched currents for the noteworthy angles.

Also, the connection is automatically with a neutral Neutral as represented in the drawing of FIG. 8*b*.

Figure 8C:
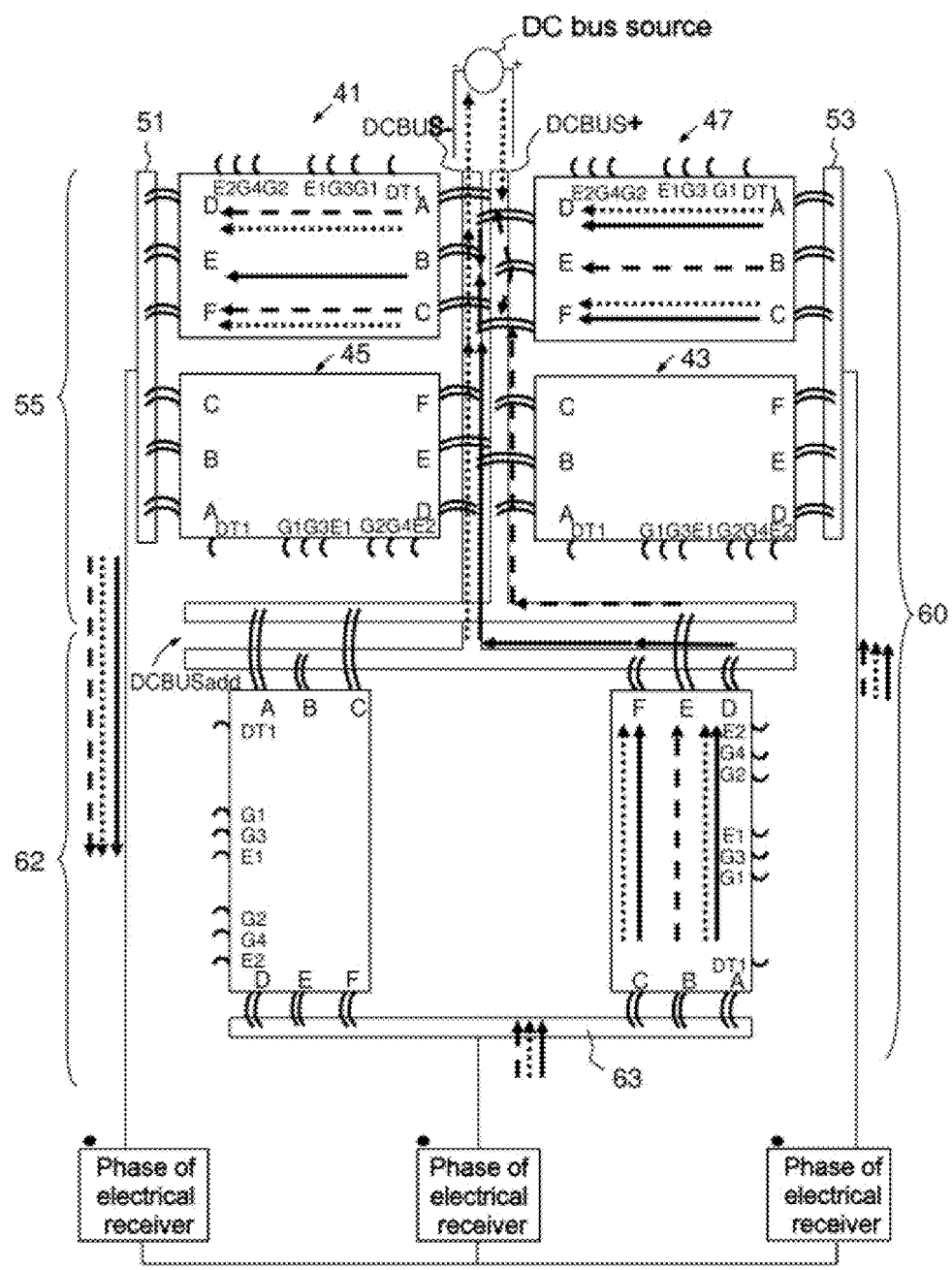

FIGS. 8*b* and 8*c* illustrate the circulations of the electrical currents in a block of FIGS. 6*a* and 6*b* with an electrical receiver with three phases and neutral, in the case of the noteworthy angle 0° in which the three currents have the respective proportions: 1, −0.5, −0.5.

In light of the two FIGS. 8b and 8c of current circulation, the electrical switching currents of the odd phase return through the DCBUS busbar (DCBUS+ and DCBUS−); if the coplanar busbar is of good quality, the inductance is very low since the path difference between the solid or continuous line, dotted line and broken line plots is minimal.

The choice between an inverted T design of FIG. 8c and a U design of FIG. 8b will be dictated by the implementation for which the stray inductance of the DCBUS segment necessary to power the two half-arms of the odd phase will be the lowest.

Also, the present invention addresses the failure tolerance requirement, including failures of the control circuits.

By reducing to a minimum the stray inductances, the solution makes it possible to use components that are better dimensioned in terms of electrical voltage, which leads to lower Joules losses in the power converter, therefore a better efficiency and an optimal thermal dimensioning.

By reducing the stray inductances to their minima, the present invention makes it possible to better exploit the power supply voltage.

By favouring the compactness of the solution, the invention reduces the weight thereof, a criterion that is important in the world of launch vehicles and satellites.

The invention claimed is:

1. A switched-mode power converter configured to control at least one phase of a polyphase electrical receiver with at least three phases, comprising at least one block of two converter arms, wherein a half-arm of a converter arm comprises:
a first set (ENS1) of P≥2 switches (I1, I2) in series;
a second set (ENS2) of P≥2 switches (I3, I4) in series, the second set (ENS2) being electrically connected in parallel between a power supply line (DCBUS+, DCBUS−) of a coplanar electrical power supply (DCBUS) and a power interface; and
a third set (ENS3) of diodes, arranged between the first set (ENS1) and the second set (ENS2), comprising M≥2 subsets (SE1, SE2, . . . , SEM) in series, indexed i∈[[1; M]], respectively comprising $N_i$≥2 diodes in parallel, said third set (ENS3) being electrically connected between the power interface and the other power supply line (DCBUS+, DCBUS−) of the coplanar electrical power supply (DCBUS).

2. The switched-mode power converter according to claim 1, wherein the M subsets comprise a same number $N_i$ of diodes in parallel.

3. The switched-mode power converter according to claim 1, comprising at least one temperature sensor.

4. The switched-mode power converter according to claim 1, wherein the switches of the first set (ENS1) are aligned and/or the switches of the second set (ENS2) are aligned and/or the subsets (SE1, SE2) of diodes of the third set (ENS3) are aligned.

5. The switched-mode power converter according to claim 1, wherein a block of two arms comprises a coplanar electrical power supply (DCBUS), provided with a positive line (DCBUS+) and a negative line (DCBUS−), arranged so as to separate two arms of the converter, and comprising a power interface for each arm, each power interface being arranged such that the two half-arms of the corresponding arm are situated between the coplanar electrical power supply (DCBUS) and the corresponding power interface.

6. The switched-mode power converter according to claim 5, wherein two half-arms forming an arm of a block of two arms of the converter, comprise a positive half-arm comprising a third set (ENS3) connected between the negative line (DCBUS−) of the coplanar electrical power supply (DCBUS) and the corresponding power interface, and a first set (ENS1) and a second set (ENS2) connected between the positive line (DCBUS+) of the coplanar electrical power supply (DCBUS) and the corresponding power interface, and
a negative half-arm comprising a third set (ENS3) connected between the positive line (DCBUS+) of the coplanar electrical power supply (DCBUS) and the corresponding power interface, and a first set (ENS1) and a second set (ENS2) connected between the negative line (DCBUS−) of the coplanar electrical power supply (DCBUS) and the corresponding power interface.

7. The switched-mode power converter according to claim 6, wherein a negative half-arm of an arm of a block of two arms of the converter is arranged facing a positive half-arm of the other arm of the block of two arms of the converter, relative to the coplanar electrical power supply (DCBUS).

8. The switched-mode power converter according to claim 1, wherein, when the number of arms is odd, the converter comprises said blocks of two arms, and a block of two arms provided with an additional arm.

9. The switched-mode power converter according to claim 8, wherein said block of two arms is provided with an additional arm comprising two half-arms arranged on either side of the extended coplanar electrical power supply (DCBUS), and a power interface of said additional arm comprising respectively, for each of the two half-arms, a part arranged such that the corresponding half-arm is situated between the coplanar electrical power supply (DCBUS) and said part of the corresponding power interface.

10. The switched-mode power converter according to claim 8, wherein said block of two arms provided with an additional arm also comprises an additional portion (DCBUSadd) of coplanar electrical power supply (DCBUS) arranged at one end and in a different direction from the rest of the coplanar electrical power supply, and a power interface of said additional arm arranged such that said additional arm is situated between said additional portion (DCBUSadd) of coplanar electrical power supply and said corresponding power interface.

11. The switched-mode power converter according to claim 10, wherein said additional portion (DCBUSadd) of coplanar electrical power supply (DCBUS) is substantially at right angles to the rest of the coplanar electrical power supply.

12. The switched-mode power converter according to claim 1, wherein it is hybrid.

13. The switched-mode power converter according to claim 1, wherein the switches comprise at least one insulated gate bipolar transistor and/or at least one insulated gate field effect transistor.

14. The switched-mode power converter according to claim 1, said converter being an inverter or a chopper.

15. A control system of at least one electrical cylinder actuator of a space launch vehicle comprising at least one switched-mode power converter according to claim 1, the electrical receiver being an electric motor and the power converter being an inverter.

16. A space launch vehicle provided with a system according to claim 15.

17. A control system of at least one steering device for antennas or solar panels of a satellite comprising at least one switched-mode power converter according to claim 1, the electrical receiver being an electric motor and the power converter being an inverter.

18. A satellite provided with a control system according to claim 17.

19. A power supply system of a satellite comprising at least one switched-mode power converter according to claim 1, the electrical receiver being a polyphase transformer and the power converter being an inverter or chopper.

20. A satellite provided with a power supply system according to claim 19.

* * * * *